US010966007B1

(12) United States Patent
Fenner et al.

(10) Patent No.: US 10,966,007 B1
(45) Date of Patent: Mar. 30, 2021

(54) HAPTIC OUTPUT SYSTEM

(71) Applicant: Apple Inc., Cupertino, CA (US)

(72) Inventors: Micah H. Fenner, San Francisco, CA (US); Camille Moussette, Los Gatos, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/191,373

(22) Filed: Nov. 14, 2018

Related U.S. Application Data

(60) Provisional application No. 62/736,354, filed on Sep. 25, 2018.

(51) Int. Cl.
*H03G 3/20* (2006.01)
*H04R 1/02* (2006.01)
(Continued)

(52) U.S. Cl.
CPC .......... *H04R 1/028* (2013.01); *H04R 1/1016* (2013.01); *H04R 29/001* (2013.01);
(Continued)

(58) Field of Classification Search
CPC . G06F 3/16; G06F 3/162; G06F 3/165; G06F 3/167; G06F 16/60; G06F 16/61; G06F 16/632; G06F 16/634; G06F 16/635; G06F 16/636; G06F 6/637; G06F 6/638; G06F 6/639; G06F 6/64; G06F 3/01; G06F 3/016; G06F 3/02; H02K 33/16; H02K 41/035; B06B 1/045; G04G 21/08; G04G 21/00; H01H 2215/028; H01H 2215/03; H01H 3/00; H04B 3/36; G08B 6/00; H04L 12/18; H04M 19/04; H04R 1/028; H04R 1/1016; H04R 2420/07; H04R 2430/01;
(Continued)

(56) References Cited

U.S. PATENT DOCUMENTS 5,196,745 A 3/1993 Trumper et al.
5,293,161 A 3/1994 MacDonald et al.
(Continued)

FOREIGN PATENT DOCUMENTS

CN 101036105 9/2007
CN 201044066 4/2008
(Continued)

OTHER PUBLICATIONS

Author Unknown, "3D Printed Mini Haptic Actuator," Autodesk, Inc., 16 pages, 2016.
(Continued)

*Primary Examiner* — Leshui Zhang
(74) *Attorney, Agent, or Firm* — Brownstein Hyatt Farber Schreck, LLP

(57) ABSTRACT

A method of providing a haptic output includes detecting a condition; determining if a head-mounted haptic accessory comprising an array of two or more haptic actuators is being worn by a user; determining an actuation pattern for the array of haptic actuators; and in response to detecting the condition and determining that the head-mounted haptic accessory is being worn by the user, initiating the actuation pattern to produce a directional haptic output that is configured to direct the user's attention along a direction.

20 Claims, 13 Drawing Sheets

(51) Int. Cl.
*H04R 1/10* (2006.01)
*H04R 29/00* (2006.01)

(52) U.S. Cl.
CPC ...... *H04R 2400/03* (2013.01); *H04R 2420/07* (2013.01); *H04R 2430/01* (2013.01)

(58) Field of Classification Search
CPC ............ H04R 29/001; H04R 2205/022; H04R 2400/03; H04R 5/02
USPC .............. 381/56, 57, 74, 312–331, 71.9, 79, 381/150–152, 310; 310/12.21; 340/407.1; 345/184
See application file for complete search history.

(56) References Cited

U.S. PATENT DOCUMENTS 5,424,756 A 6/1995 Ho et al.
5,434,549 A 7/1995 Hirabayashi et al.
5,436,622 A 7/1995 Gutman et al.
5,668,423 A 9/1997 You et al.
5,842,967 A 1/1998 Kroll
5,739,759 A 4/1998 Nakazawa et al.
6,084,319 A 7/2000 Kamata et al.
6,342,880 B2 1/2002 Rosenberg et al.
6,373,465 B2 4/2002 Jolly et al.
6,388,789 B1 5/2002 Bernstein
6,438,393 B1 8/2002 Surronen
6,445,093 B1 9/2002 Binnard
6,493,612 B1 12/2002 Bisset et al.
6,554,191 B2 4/2003 Yoneya
6,693,622 B1 2/2004 Shahoian et al.
6,777,895 B2 8/2004 Shimoda et al.
6,822,635 B2 11/2004 Shahoian
6,864,877 B2 3/2005 Braun et al.
6,952,203 B2 10/2005 Banerjee et al.
6,988,414 B2 1/2006 Ruhrig et al.
7,068,168 B2 6/2006 Girshovich et al.
7,080,271 B2 7/2006 Kardach et al.
7,126,254 B2 10/2006 Nanataki et al.
7,130,664 B1 10/2006 Williams
7,196,688 B2 3/2007 Shena et al.
7,202,851 B2 4/2007 Cunningham et al.
7,234,379 B2 6/2007 Claesson et al.
7,253,350 B2 8/2007 Noro et al.
7,276,907 B2 10/2007 Kitagawa et al.
7,321,180 B2 1/2008 Takeuchi et al.
7,323,959 B2 1/2008 Naka et al.
7,336,006 B2 2/2008 Watanabe et al.
7,339,572 B2 3/2008 Schena
7,355,305 B2 4/2008 Nakamura et al.
7,360,446 B2 4/2008 Dai et al.
7,370,289 B1 5/2008 Ebert et al.
7,385,874 B2 6/2008 Vuilleumier
7,392,066 B2 6/2008 Hapamas
7,423,631 B2 9/2008 Shahoian et al.
7,508,382 B2 3/2009 Denoue et al.
7,570,254 B2 8/2009 Suzuki et al.
7,576,477 B2 8/2009 Koizumi
7,656,388 B2 2/2010 Schena et al.
7,667,371 B2 2/2010 Sadler et al.
7,667,691 B2 2/2010 Boss et al.
7,675,414 B2 3/2010 Ray
7,710,397 B2 5/2010 Krah et al.
7,710,399 B2 5/2010 Bruneau et al.
7,741,938 B2 6/2010 Kramlich
7,755,605 B2 7/2010 Daniel et al.
7,798,982 B2 9/2010 Zets et al.
7,825,903 B2 11/2010 Anastas et al.
7,855,657 B2 12/2010 Doemens et al.
7,890,863 B2 2/2011 Grant et al.
7,893,922 B2 2/2011 Klinghult et al.
7,904,210 B2 3/2011 Pfau et al.
7,911,328 B2 3/2011 Luden et al.
7,919,945 B2 4/2011 Houston et al.
7,952,261 B2 5/2011 Lipton et al.
7,952,566 B2 5/2011 Poupyrev et al.
7,956,770 B2 6/2011 Klinghult et al.
7,976,230 B2 7/2011 Ryynanen et al.
8,002,089 B2 8/2011 Jasso et al.
8,020,266 B2 9/2011 Ulm et al.
8,040,224 B2 10/2011 Hwang
8,053,688 B2 11/2011 Conzola et al.
8,063,892 B2 11/2011 Shahoian
8,072,418 B2 12/2011 Crawford et al.
8,081,156 B2 12/2011 Ruettiger
8,125,453 B2 2/2012 Shahoian et al.
8,154,537 B2 4/2012 Olien et al.
8,174,495 B2 5/2012 Takashima et al.
8,174,512 B2 5/2012 Ramstein et al.
8,188,989 B2 5/2012 Levin
8,169,402 B2 6/2012 Shahoian et al.
8,217,892 B2 7/2012 Meadors
8,217,910 B2 7/2012 Stallings et al.
8,232,494 B2 7/2012 Purcocks
8,248,386 B2 8/2012 Harrison
8,253,686 B2 8/2012 Kyung
8,262,480 B2 9/2012 Cohen et al.
8,264,465 B2 9/2012 Grant et al.
8,265,292 B2 9/2012 Leichter
8,265,308 B2 9/2012 Gitzinger et al.
8,344,834 B2 1/2013 Niiyama
8,345,025 B2 1/2013 Seibert et al.
8,351,104 B2 1/2013 Zaifrani et al.
8,378,797 B2 2/2013 Pance et al.
8,378,965 B2 2/2013 Gregorio et al.
8,384,316 B2 2/2013 Houston et al.
8,390,218 B2 3/2013 Houston et al.
8,390,572 B2 3/2013 Marsden et al.
8,390,594 B2 3/2013 Modarres et al.
8,400,027 B2 3/2013 Dong et al.
8,405,618 B2 3/2013 Colgate et al.
8,421,609 B2 4/2013 Kim et al.
8,432,365 B2 4/2013 Kim et al.
8,469,806 B2 6/2013 Grant et al.
8,471,690 B2 6/2013 Hennig et al.
8,493,177 B2 7/2013 Flaherty et al.
8,493,189 B2 7/2013 Suzuki
8,562,489 B2 10/2013 Burton
8,576,171 B2 11/2013 Grant
8,598,750 B2 12/2013 Park
8,598,972 B2 12/2013 Cho et al.
8,604,670 B2 12/2013 Mahameed et al.
8,605,141 B2 12/2013 Dialameh et al.
8,614,431 B2 12/2013 Huppi et al.
8,619,031 B2 12/2013 Hayward
8,624,448 B2 1/2014 Kaiser et al.
8,628,173 B2 1/2014 Stephens et al.
8,633,916 B2 1/2014 Bernstein et al.
8,639,485 B2 1/2014 Connacher et al.
8,648,829 B2 2/2014 Shahoian et al.
8,653,785 B2 2/2014 Collopy
8,654,524 B2 2/2014 Pance et al.
8,681,130 B2 3/2014 Adhikari
8,686,952 B2 4/2014 Burrough
8,717,151 B2 5/2014 Forutanpour et al.
8,730,182 B2 5/2014 Modarres et al.
8,749,495 B2 6/2014 Grant et al.
8,754,759 B2 6/2014 Fadell et al.
8,760,037 B2 6/2014 Eshed et al.
8,773,247 B2 7/2014 Ullrich
8,780,074 B2 7/2014 Castillo et al.
8,797,153 B2 8/2014 Vanhelle et al.
8,797,295 B2 8/2014 Bernstein
8,803,670 B2 8/2014 Steckel et al.
8,834,390 B2 9/2014 Couvillon
8,836,502 B2 9/2014 Culbert et al.
8,836,643 B2 9/2014 Romera Joliff et al.
8,867,757 B1 10/2014 Ooi
8,872,448 B2 10/2014 Boldyrev et al.
8,878,401 B2 11/2014 Lee
8,890,824 B2 11/2014 Guard
8,907,661 B2 12/2014 Maier et al.
8,976,139 B2 3/2015 Koga et al.

(56) References Cited

U.S. PATENT DOCUMENTS

| | | | |
|---|---|---|---|
| 8,976,141 | B2 | 3/2015 | Myers et al. |
| 8,977,376 | B1 | 3/2015 | Lin et al. |
| 8,981,682 | B2 | 3/2015 | Delson et al. |
| 8,987,951 | B2 | 3/2015 | Park |
| 9,008,730 | B2 | 4/2015 | Kim et al. |
| 9,024,738 | B2 | 5/2015 | Van Schyndel et al. |
| 9,046,947 | B2 | 6/2015 | Takeda |
| 9,052,785 | B2 | 6/2015 | Horie |
| 9,054,605 | B2 | 6/2015 | Jung et al. |
| 9,058,077 | B2 | 6/2015 | Lazaridis et al. |
| 9,086,727 | B2 | 7/2015 | Tidemand et al. |
| 9,092,056 | B2 | 7/2015 | Myers et al. |
| 9,104,285 | B2 | 8/2015 | Colgate et al. |
| 9,116,570 | B2 | 8/2015 | Lee et al. |
| 9,122,330 | B2 | 9/2015 | Bau et al. |
| 9,134,796 | B2 | 9/2015 | Lemmons et al. |
| 9,172,669 | B2 | 10/2015 | Swink et al. |
| 9,182,837 | B2 | 11/2015 | Day |
| 9,218,727 | B2 | 12/2015 | Rothkopf et al. |
| 9,245,704 | B2 | 1/2016 | Maharjan et al. |
| 9,256,287 | B2 | 2/2016 | Shinozaki et al. |
| 9,274,601 | B2 | 3/2016 | Faubert et al. |
| 9,280,205 | B2 | 3/2016 | Rosenberg et al. |
| 9,286,907 | B2 | 3/2016 | Yang et al. |
| 9,304,587 | B2 | 4/2016 | Wright et al. |
| 9,319,150 | B2 | 4/2016 | Peeler et al. |
| 9,361,018 | B2 | 6/2016 | Pasquero et al. |
| 9,396,629 | B1 | 7/2016 | Weber et al. |
| 9,430,042 | B2 | 8/2016 | Levin |
| 9,436,280 | B2 | 9/2016 | Tartz et al. |
| 9,442,570 | B2 | 9/2016 | Slonneger |
| 9,448,713 | B2 | 9/2016 | Cruz-Hernandez et al. |
| 9,449,476 | B2 | 9/2016 | Lynn et al. |
| 9,459,734 | B2 | 10/2016 | Day |
| 9,466,783 | B2 | 10/2016 | Olien et al. |
| 9,489,049 | B2 | 11/2016 | Li |
| 9,496,777 | B2 | 11/2016 | Jung |
| 9,501,149 | B2 | 11/2016 | Burnbaum et al. |
| 9,513,704 | B2 | 12/2016 | Heubel et al. |
| 9,519,346 | B2 | 12/2016 | Lacroix |
| 9,535,500 | B2 | 1/2017 | Pasquero et al. |
| 9,539,164 | B2 | 1/2017 | Sanders et al. |
| 9,542,028 | B2 | 1/2017 | Filiz et al. |
| 9,557,830 | B2 | 1/2017 | Grant |
| 9,557,857 | B2 | 1/2017 | Schediwy |
| 9,563,274 | B2 | 2/2017 | Senanayake |
| 9,594,429 | B2 | 3/2017 | Bard et al. |
| 9,600,037 | B2 | 3/2017 | Pance et al. |
| 9,600,071 | B2 | 3/2017 | Rothkopf |
| 9,607,491 | B1 | 3/2017 | Mortimer |
| 9,632,583 | B2 | 4/2017 | Virtanen et al. |
| 9,639,158 | B2 | 5/2017 | Levesque |
| 9,666,040 | B2 | 5/2017 | Flaherty et al. |
| 9,707,593 | B2 | 7/2017 | Berte |
| 9,710,061 | B2 | 7/2017 | Pance et al. |
| 9,727,238 | B2 | 8/2017 | Peh et al. |
| 9,733,704 | B2 | 8/2017 | Cruz-Hernandez et al. |
| 9,762,236 | B2 | 9/2017 | Chen |
| 9,829,981 | B1 | 11/2017 | Ji |
| 9,830,782 | B2 | 11/2017 | Morrell et al. |
| 9,857,872 | B2 | 1/2018 | Terlizzi et al. |
| 9,870,053 | B2 | 1/2018 | Modarres |
| 9,874,980 | B2 | 1/2018 | Brunet et al. |
| 9,875,625 | B2 | 1/2018 | Khoshkava et al. |
| 9,886,090 | B2 | 2/2018 | Silvanto et al. |
| 9,902,186 | B2 | 2/2018 | Whiteman et al. |
| 9,904,393 | B2 | 2/2018 | Frey et al. |
| 9,878,239 | B2 | 3/2018 | Heubel et al. |
| 9,921,649 | B2 | 3/2018 | Grant et al. |
| 9,927,887 | B2 | 3/2018 | Bulea |
| 9,927,902 | B2 | 3/2018 | Burr et al. |
| 9,928,950 | B2 | 3/2018 | Lubinski et al. |
| 9,940,013 | B2 | 4/2018 | Choi et al. |
| 9,971,407 | B2 | 5/2018 | Holenarsipur et al. |
| 9,977,499 | B2 | 5/2018 | Westerman et al. |
| 9,990,040 | B2 | 6/2018 | Levesque |
| 9,996,199 | B2 | 6/2018 | Park |
| 10,025,399 | B2 | 7/2018 | Kim et al. |
| 10,037,660 | B2 | 7/2018 | Khoshkava et al. |
| 10,061,385 | B2 | 8/2018 | Churikov |
| 10,069,392 | B2 | 9/2018 | Degner et al. |
| 10,078,483 | B2 | 9/2018 | Finnan et al. |
| 10,082,873 | B2 | 9/2018 | Zhang |
| 10,108,265 | B2 | 10/2018 | Harley et al. |
| 10,120,446 | B2 | 11/2018 | Pance et al. |
| 10,120,478 | B2 | 11/2018 | Filiz et al. |
| 10,120,484 | B2 | 11/2018 | Endo et al. |
| 10,122,184 | B2 | 11/2018 | Smadi |
| 10,133,351 | B2 | 11/2018 | Weber et al. |
| 10,139,976 | B2 | 11/2018 | Iuchi et al. |
| 10,152,131 | B2 | 12/2018 | Grant |
| 10,152,182 | B2 | 12/2018 | Haran et al. |
| 10,235,849 | B1 | 3/2019 | Levesque |
| 10,275,075 | B2 | 4/2019 | Hwang et al. |
| 10,282,014 | B2 | 5/2019 | Butler et al. |
| 10,289,199 | B2 | 5/2019 | Hoellwarth |
| 10,346,117 | B2 | 7/2019 | Sylvan et al. |
| 10,372,214 | B1 | 8/2019 | Gleeson et al. |
| 10,394,326 | B2 | 8/2019 | Ono |
| 10,430,077 | B2 | 10/2019 | Lee |
| 10,437,359 | B1 | 10/2019 | Wang et al. |
| 10,556,252 | B2 | 2/2020 | Tsang et al. |
| 10,585,480 | B1 | 3/2020 | Bushnell et al. |
| 10,649,529 | B1 | 5/2020 | Nekimken et al. |
| 10,685,626 | B2 | 6/2020 | Kim et al. |
| 10,768,738 | B1 | 9/2020 | Wang et al. |
| 10,845,220 | B2 | 11/2020 | Song et al. |
| 2003/0117132 | A1 | 6/2003 | Klinghult |
| 2005/0036603 | A1 | 2/2005 | Hughes |
| 2005/0191604 | A1 | 9/2005 | Allen |
| 2005/0230594 | A1 | 10/2005 | Sato et al. |
| 2006/0017691 | A1 | 1/2006 | Cruz-Hernandez et al. |
| 2006/0209037 | A1 | 9/2006 | Wang et al. |
| 2006/0223547 | A1 | 10/2006 | Chin et al. |
| 2006/0252463 | A1 | 11/2006 | Liao |
| 2007/0106457 | A1 | 5/2007 | Rosenberg |
| 2007/0152974 | A1 | 7/2007 | Kim et al. |
| 2008/0062145 | A1 | 3/2008 | Shahoian |
| 2008/0062624 | A1 | 3/2008 | Regen |
| 2008/0084384 | A1 | 4/2008 | Gregorio et al. |
| 2008/0111791 | A1 | 5/2008 | Nikittin |
| 2009/0085879 | A1 | 4/2009 | Dai et al. |
| 2009/0115734 | A1 | 5/2009 | Fredriksson et al. |
| 2009/0166098 | A1 | 7/2009 | Sunder |
| 2009/0167702 | A1 | 7/2009 | Nurmi |
| 2009/0174672 | A1 | 7/2009 | Schmidt |
| 2009/0207129 | A1 | 8/2009 | Ullrich et al. |
| 2009/0225046 | A1 | 9/2009 | Kim et al. |
| 2009/0243404 | A1 | 10/2009 | Kim et al. |
| 2009/0267892 | A1 | 10/2009 | Faubert |
| 2010/0116629 | A1 | 5/2010 | Borissov et al. |
| 2010/0225600 | A1 | 9/2010 | Dai et al. |
| 2010/0231508 | A1 | 9/2010 | Cruz-Hernandez et al. |
| 2010/0313425 | A1 | 12/2010 | Hawes |
| 2010/0328229 | A1 | 12/2010 | Weber et al. |
| 2011/0115754 | A1 | 5/2011 | Cruz-Hernandez |
| 2011/0128239 | A1 | 6/2011 | Polyakov et al. |
| 2011/0132114 | A1 | 6/2011 | Siotis |
| 2011/0169347 | A1 | 7/2011 | Miyamoto et al. |
| 2011/0205038 | A1 | 8/2011 | Drouin et al. |
| 2011/0261021 | A1 | 10/2011 | Modarres et al. |
| 2012/0038469 | A1 | 2/2012 | Dehmoubed et al. |
| 2012/0038471 | A1 | 2/2012 | Kim et al. |
| 2012/0056825 | A1 | 3/2012 | Ramsay et al. |
| 2012/0062491 | A1 | 3/2012 | Coni et al. |
| 2012/0113008 | A1 | 5/2012 | Makinen et al. |
| 2012/0127071 | A1 | 5/2012 | Jitkoff et al. |
| 2012/0232780 | A1* | 9/2012 | Delson .................... A63F 13/06 701/400 |
| 2012/0235942 | A1 | 9/2012 | Shahoian |
| 2012/0249474 | A1 | 10/2012 | Pratt et al. |
| 2012/0327006 | A1 | 12/2012 | Israr et al. |
| 2013/0016042 | A1 | 1/2013 | Makinen et al. |
| 2013/0021296 | A1 | 1/2013 | Min et al. |

(56) References Cited

U.S. PATENT DOCUMENTS

| | | | | |
|---|---|---|---|---|
| 2013/0043670 | A1 | 2/2013 | Holmes | |
| 2013/0044049 | A1 | 2/2013 | Biggs et al. | |
| 2013/0076635 | A1 | 3/2013 | Lin | |
| 2013/0154996 | A1 | 6/2013 | Trend et al. | |
| 2013/0182064 | A1* | 7/2013 | Muench | H04N 7/15 348/14.16 |
| 2013/0207793 | A1 | 8/2013 | Weaber et al. | |
| 2014/0062948 | A1 | 3/2014 | Lee et al. | |
| 2014/0125470 | A1 | 5/2014 | Rosenberg | |
| 2014/0168175 | A1 | 6/2014 | Mercea et al. | |
| 2015/0084909 | A1 | 3/2015 | Worfolk et al. | |
| 2015/0126070 | A1 | 5/2015 | Candelore | |
| 2015/0186609 | A1 | 7/2015 | Utter, II | |
| 2015/0234493 | A1 | 8/2015 | Parivar et al. | |
| 2015/0293592 | A1 | 10/2015 | Cheong et al. | |
| 2016/0098107 | A1 | 4/2016 | Morrell et al. | |
| 2016/0163165 | A1* | 6/2016 | Morrell | G08B 6/00 340/407.1 |
| 2016/0171767 | A1 | 6/2016 | Anderson et al. | |
| 2016/0293829 | A1 | 10/2016 | Maharjan et al. | |
| 2016/0327911 | A1 | 11/2016 | Eim et al. | |
| 2016/0328930 | A1 | 11/2016 | Weber et al. | |
| 2016/0379776 | A1 | 12/2016 | Oakley | |
| 2017/0003744 | A1 | 1/2017 | Bard et al. | |
| 2017/0024010 | A1 | 1/2017 | Weinraub | |
| 2017/0090655 | A1 | 3/2017 | Zhang et al. | |
| 2017/0111734 | A1 | 4/2017 | Macours | |
| 2017/0180863 | A1* | 6/2017 | Biggs | B06B 1/045 |
| 2017/0249024 | A1 | 8/2017 | Jackson et al. | |
| 2017/0285843 | A1 | 10/2017 | Roberts-Hoffman et al. | |
| 2017/0336273 | A1 | 11/2017 | Elangovan et al. | |
| 2017/0357325 | A1 | 12/2017 | Yang et al. | |
| 2018/0005496 | A1 | 1/2018 | Dogiamis | |
| 2018/0014096 | A1 | 1/2018 | Miyoshi | |
| 2018/0029078 | A1 | 2/2018 | Park et al. | |
| 2018/0048954 | A1* | 2/2018 | Forstner | H04R 1/1041 |
| 2018/0059839 | A1 | 3/2018 | Kim et al. | |
| 2018/0081438 | A1 | 3/2018 | Lehmann | |
| 2018/0181204 | A1 | 6/2018 | Weinraub | |
| 2018/0194229 | A1 | 7/2018 | Wachinger | |
| 2018/0288519 | A1* | 10/2018 | Min | H04R 3/12 |
| 2018/0321841 | A1 | 11/2018 | Lapp | |
| 2018/0335883 | A1 | 11/2018 | Choi et al. | |
| 2019/0064997 | A1 | 2/2019 | Wang et al. | |
| 2019/0073079 | A1 | 3/2019 | Xu et al. | |
| 2019/0278232 | A1 | 9/2019 | Ely et al. | |
| 2019/0310724 | A1 | 10/2019 | Yazdandoost | |
| 2020/0004337 | A1 | 1/2020 | Hendren et al. | |
| 2020/0073477 | A1 | 3/2020 | Pandya et al. | |
| 2020/0233495 | A1 | 7/2020 | Bushnell et al. | |

FOREIGN PATENT DOCUMENTS

| | | |
|---|---|---|
| CN | 101409164 | 4/2009 |
| CN | 101436099 | 5/2009 |
| CN | 101663104 | 3/2010 |
| CN | 101872257 | 10/2010 |
| CN | 201897778 | 7/2011 |
| CN | 201945951 | 8/2011 |
| CN | 102349039 | 2/2012 |
| CN | 203405773 | 1/2014 |
| CN | 203630729 | 6/2014 |
| CN | 104679233 | 6/2015 |
| CN | 105144052 | 12/2015 |
| CN | 106133650 | 11/2016 |
| CN | 106354203 | 1/2017 |
| CN | 206339935 | 7/2017 |
| CN | 207115337 | 3/2018 |
| DE | 214030 | 3/1983 |
| EP | 1686776 | 8/2006 |
| EP | 2743798 | 6/2014 |
| JP | 2004129120 | 4/2004 |
| JP | 2004236202 | 8/2004 |
| JP | 2010537279 | 12/2010 |
| JP | 2010540320 | 12/2010 |
| KR | 20050033909 | 4/2005 |
| KR | 101016208 | 2/2011 |
| KR | 20130137124 | 12/2013 |
| TW | 2010035805 | 10/2010 |
| TW | 201430623 | 8/2014 |
| WO | WO2002/073587 | 9/2002 |
| WO | WO2006/091494 | 8/2006 |
| WO | WO2007/049253 | 5/2007 |
| WO | WO2007/114631 | 10/2007 |
| WO | WO2009/038862 | 3/2009 |
| WO | WO2009/156145 | 12/2009 |
| WO | WO2010/129892 | 11/2010 |
| WO | WO2013/169303 | 11/2013 |
| WO | WO2014/066516 | 5/2014 |
| WO | WO 2014/200766 | 12/2014 |
| WO | WO2016/091944 | 6/2016 |
| WO | WO 2016/144563 | 9/2016 |

OTHER PUBLICATIONS

Hasser et al., "Preliminary Evaluation of a Shape-Memory Alloy Tactile Feedback Display," Advances in Robotics, Mechantronics, and Haptic Interfaces, ASME, DSC-vol. 49, pp. 73-80, 1993.
Hill et al., "Real-time Estimation of Human Impedance for Haptic Interfaces," Stanford Telerobotics Laboratory, Department of Mechanical Engineering, Standford University, 6 pages, at least as early as Sep. 30, 2009.
Lee et al, "Haptic Pen: Tactile Feedback Stylus for Touch Screens," Mitsubishi Electric Research Laboratories, http://wwwlmerl.com, 6 pages, Oct. 2004.
Stein et al., "A process chain for integrating piezoelectric transducers into aluminum die castings to generate smart lightweight structures," Results in Physics 7, pp. 2534-2539, 2017.
U.S. Appl. No. 16/377,197, filed Apr. 6, 2019, Pandya et al.
"Lofelt at Smart Haptics 2017," Auto-generated transcript from YouTube video clip, uploaded on Jun. 12, 2018 by user "Lofelt," Retrieved from Internet: <https://www.youtube.com/watch?v=3w7LTQkS430>, 3 pages.
"Tutorial: Haptic Feedback Using Music and Audio—Precision Microdrives," Retrieved from Internet Nov. 13, 2019: https://www.precisionmicrodrives.com/haptic-feedback/tutorial-haptic-feedback-using-music-and-audio/, 9 pages.
"Feel what you hear: haptic feedback as an accompaniment to mobile music playback," Retrieved from Internet Nov. 13, 2019: https://dl.acm.org/citation.cfm?id=2019336, 2 pages.
"Auto Haptic Widget for Android," Retrieved from Internet Nov. 13, 2019, https://apkpure.com/auto-haptic-widget/com.immersion.android.autohaptic, 3 pages.
D-BOX Home, Retrieved from Internet Nov. 12, 2019: https://web.archive.org/web/20180922193345/https://www.d-box.com/en, 4 pages.

* cited by examiner

| | | | |
|---|---|---|---|
| INTRUSIVENESS OF HAPTIC OUTPUT | MORE INTRUSIVE | → | LESS INTRUSIVE |
| DURATION OF HAPTIC OUTPUT | SHORTER (HAPTIC SCHEME 1) | → (HAPTIC SCHEME 2) | LONGER (HAPTIC SCHEME 3) |

HAPTIC OUTPUT SYSTEM

CROSS-REFERENCE TO RELATED APPLICATION(S)

This application is a nonprovisional patent application of and claims the benefit of U.S. Provisional Patent Application No. 62/736,354, Sep. 25, 2018 and titled "Haptic Output System," the disclosure of which is hereby incorporated herein by reference in its entirety.

FIELD

The described embodiments relate generally to wearable electronic devices, and, more particularly, to wearable electronic devices that produce haptic outputs that can be felt by wearers of the electronic devices.

BACKGROUND

Wearable electronic devices are increasingly ubiquitous in modern society. For example, wireless audio devices (e.g., headphones, earbuds) are worn to provide convenient listening experiences for music and other audio. Head-mounted displays are worn to provide virtual or augmented reality environments to users for gaming, productivity, entertainment, and the like. Wrist-worn devices, such as smart watches, provide convenient access to various types of information and applications, including weather information, messaging applications, activity tracking applications, and the like. Some wearable devices, such as smart watches, may use haptic outputs to provide tactile alerts to the wearer, such as to indicate that a message has been received or that an activity goal has been reached.

SUMMARY

A method of providing a haptic output includes detecting a condition, determining if a head-mounted haptic accessory comprising an array of two or more haptic actuators is being worn by a user, determining an actuation pattern for the array of haptic actuators, and in response to detecting the condition and determining that the head-mounted haptic accessory is being worn by the user, initiating the actuation pattern to produce a directional haptic output that is configured to direct the user's attention along a direction.

The head-mounted haptic accessory may include a pair of earbuds, each earbud including an earbud body, a speaker positioned within the earbud body, and a haptic actuator positioned within the earbud body and configured to impart a haptic output to the user's ear. Detecting the condition may include detecting a presence of an audio source in an audio signal that is sent to the pair of earbuds. The method may further include determining a virtual position of the audio source relative to the user. Initiating the actuation pattern may include initiating a first haptic output at a first earbud of the pair of earbuds and subsequently initiating a second haptic output at a second earbud of the pair of earbuds. The directional haptic output may be configured to direct the user's attention toward the direction, which corresponds to the virtual position of the audio source. The audio signal may correspond to audio of a teleconference having multiple participants, the audio source may correspond to a participant of the multiple participants, and each respective participant of the multiple participants may have a distinct respective virtual position relative to the user.

The head-mounted haptic accessory may include an earbud including an earbud body and a haptic actuator positioned within the earbud body and comprising a movable mass, and initiating the actuation pattern may cause the haptic actuator to move the movable mass along an actuation direction that is configured to impart a reorientation force on the user.

Detecting the condition may include detecting a presence of an audio source in an audio signal that is sent to the pair of earbuds. The method may further include determining a virtual position of the audio source relative to the user, after initiating the actuation pattern, determining the user's orientation relative to the virtual position of the audio source, and increasing a volume of an audio output corresponding to the audio signal as the user's orientation becomes aligned with the virtual position of the audio source.

Detecting the condition may include detecting a notification associated with a graphical object. The graphical object may have a virtual position in a virtual environment being presented to the user, and the directional haptic output may be configured to direct the user's attention toward the direction, which corresponds to the virtual position of the graphical object.

Detecting the condition may include detecting an interactive object in a virtual environment being presented to the user. The interactive object may have a virtual position within the virtual environment, and the directional haptic output may be configured to direct the user's attention toward the direction, which corresponds to the virtual position of the interactive object.

An electronic system may include an earbud comprising an earbud body configured to be received at least partially within an ear of a user, a speaker positioned within the earbud body and configured to output sound into an ear canal of the user's ear, and a haptic actuator positioned within the earbud body and configured to impart a haptic output to the user's ear. The haptic actuator may be a linear resonant actuator having a linearly translatable mass that is configured to produce the haptic output.

The electronic system may further include a processor communicatively coupled with the haptic actuator and configured to detect a condition, determine an actuation pattern for the haptic actuator, and in response to detecting the condition, initiate the haptic output in accordance with the actuation pattern. The electronic system may further include a portable electronic device in wireless communication with the earbud, and the processor may be within the portable electronic device.

The electronic system may further include an additional earbud comprising an additional earbud body, an additional speaker positioned within the additional earbud body, and an additional haptic actuator positioned within the additional earbud body. The haptic actuator may include a mass configured to move along a horizontal direction when the earbud is worn in the user's ear, and the mass may be configured to produce an impulse that is perceptible as a force acting on the user's ear in a single direction.

A method of providing a haptic output may include detecting an audio feature in audio data, determining a characteristic frequency of the audio feature, causing a wearable electronic device to produce an audio output corresponding to the audio data and including the audio feature, and while the audio feature is being outputted, causing a haptic actuator of the wearable electronic device to produce a haptic output at a haptic frequency that corresponds to the characteristic frequency of the audio feature. The haptic frequency may be a harmonic or subharmonic of the characteristic frequency. The haptic output may be produced for an entire duration of the audio feature.

Detecting the audio feature may include detecting a triggering event in the audio data, and the triggering event may correspond to a rate of change of volume of the audio output that satisfies a threshold. Detecting the audio feature may include detecting audio content within a target frequency range.

The method may further include determining a variation in an audio characteristic of the audio feature and varying a haptic characteristic of the haptic output in accordance with the variation in the audio characteristic of the audio feature. The variation in the audio characteristic of the audio feature may be a variation in an amplitude of the audio feature, and varying a component of the haptic output in accordance with the variation in the audio characteristic of the audio feature may include varying an intensity of the haptic output in accordance with the variation in the amplitude.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1A:
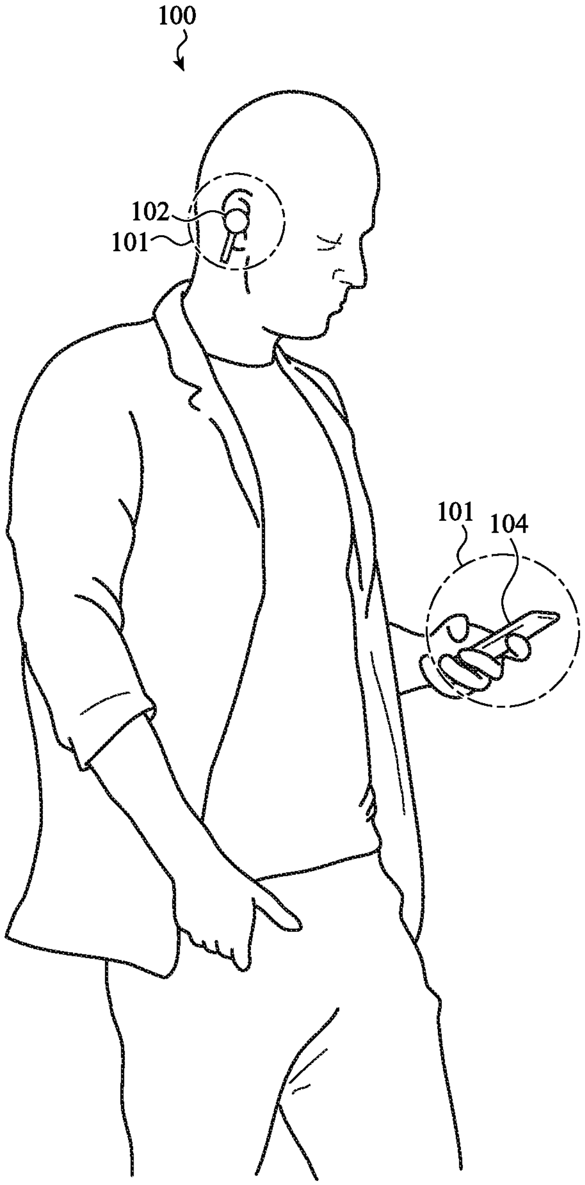
FIGS. 1A-1B depict an example electronic system in use by a user.

Reference will now be made in detail to representative embodiments illustrated in the accompanying drawings. It should be understood that the following description is not intended to limit the embodiments to one preferred embodiment. To the contrary, it is intended to cover alternatives, modifications, and equivalents as can be included within the spirit and scope of the described embodiments as defined by the appended claims.

The embodiments herein are generally directed to wearable electronic devices that include haptic actuators, and more particularly, to haptic outputs that are coordinated with a position of a virtual object (which may correspond to or represent a person, an audio source, an instrument, a graphical object, etc.) relative to the wearer of the electronic device. The wearable electronic devices may include an array of haptic actuators (e.g., two or more haptic actuators) that can be actuated according to an actuation pattern in order to direct the wearer's attention in a particular direction. For example, an array of haptic actuators in contact with various locations on a wearer's head may be actuated in a pattern that produces a sensation having a distinct directional component. More particularly, the user may feel the pattern moving left or right. The user may then be motivated to turn his or her head or body in the direction indicated by the haptic pattern.

Indicating a direction via directional haptic outputs may be used to enhance various types of interactions with audio and/or visual content, and in particular to enhance interaction with content that has a real or virtual position relative to the wearer, and/or content that has a visual or audible component. For example, and as described in greater detail herein, directional haptic outputs may be used to direct a wearer's attention along a direction towards a virtual location of a participant in a multi-party telephone conference. As another example, a directional haptic output may be used to direct a user's attention towards the position of a graphical object in a virtual or augmented reality environment.

Haptic outputs provided via a wearable electronic device may also be used to enhance an experience of consuming audio or video content. For example, haptic outputs may be synchronized with certain audio features in a musical work or with audio or visual features of video content. In the context of music, the haptic outputs may be synchronized with notes from a certain instrument or notes having a certain prominence in the music. In some cases, the position of the wearer relative to a virtual position of an instrument may also affect the haptic output provided to the user. In the context of video, the haptic outputs may be synchronized with some visual and/or audio content of the video, such as by initiating a haptic output when an object appears to move towards or near the viewer.

These and other haptic outputs may be imparted to the user via various types of wearable devices. For example, a pair of earbuds, such as those that are conventionally used to provide audio to a user, may include haptic actuators that can produce haptic or tactile sensations to a user's ear. As used herein, the term ear may refer to any portion of an ear of a person, including the outer ear, middle ear, and/or inner ear. The outer ear of a person, which may include the auricle or pinna (e.g., the visible part of the ear that is external to a person's head) and the ear canal. Earbuds may reside at least partially in the ear canal, and may contact portions of the ear canal and/or the auricle of the ear. Accordingly, haptic actuators in earbuds may produce haptic or tactile sensations on the auricle and/or ear canal of a person's ear.

As another example, a pair of glasses may include haptic actuators (e.g., on the temple pieces and/or nose bridge). As yet another example, a headband, hat, or other head-worn object may include haptic actuators. In some cases, these wearable device(s) include an array of two or more haptic actuators, which may facilitate the production of directional haptic outputs by using different types of actuation patterns for the various actuators in the array.

Figure 1B:
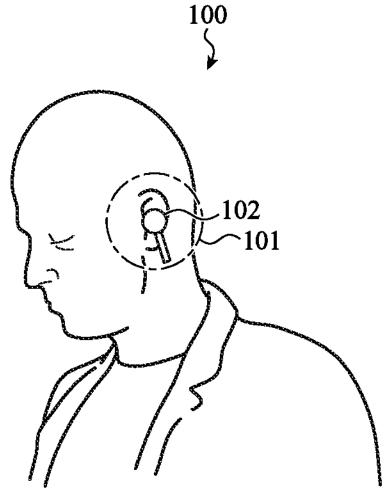

FIGS. 1A-1B illustrate right and left sides, respectively, of a user 100 using an electronic system 101. The electronic system 101 may include a head-mounted haptic accessory 102 and a processing system 104, and may define or be referred to as a haptic output system. For example, the head-mounted haptic accessory 102 and the portions of the processing system 104 that interact with the head-mounted haptic accessory 102 (or otherwise provide functionality relating to producing haptic outputs via the head-mounted haptic accessory 102) may define the haptic output system.

The head-mounted haptic accessory 102 is shown as a pair of earbuds that are configured to be positioned within an ear of the user 100. The head-mounted haptic accessory 102 may include an array of two or more haptic actuators. For example, in the case of the earbuds shown in FIGS. 1A-1B, each earbud may include a haptic actuator to define an array of two haptic actuators in contact with the user 100 (e.g., with the user's ears). In other embodiments, as described herein, the head-mounted haptic accessory may be another type of wearable, head-mounted device, such as over-ear or on-ear headphones, in-ear monitors, a pair of glasses, a headband, a hat, a head-mounted display, etc. In some cases, the head-mounted haptic accessory 102 may also include one or more speakers that produce audio outputs.

The electronic system 101 may include a processing system 104, which may be a device that is separate from the head-mounted haptic accessory 102 (as shown in FIG. 1A), or it may be integrated with the head-mounted haptic accessory 102. The processing system 104 is depicted in FIG. 1A as a portable electronic device, such as a mobile phone or smartphone, however, this merely represents one type or form factor for the processing system 104. In other cases, the processing system 104 may be another type of portable electronic device, such as a tablet computer, a wearable electronic device (e.g., a smart watch, a head-mounted display), a notebook computer, or any other suitable portable electronic device. In some cases, the processing system 104 may be another type of electronic or computing device, such as a desktop computer, a gaming console, a voice-activated digital assistant, or any other suitable electronic device. The processing system 104 may perform various operations of the electronic system 101, including for example determining whether a head-mounted haptic accessory 102 is being worn, determining when haptic outputs are to be produced via the head-mounted haptic accessory 102, determining actuation patterns for the haptic actuators of the head-mounted haptic accessory 102, and the like. The processing system 104 may also provide audio signals to the head-mounted haptic accessory 102 (such as where the head-mounted haptic accessory 102 is a pair of headphones or earbuds). Audio signals may be digital or analog, and may be processed by the processing system 104 and/or the head-mounted haptic accessory 102 to produce an audio output (e.g., audible sound). Audio signals may correspond to, include, or represent audio data from various different sources, such as teleconference voice data, an audio portion of a real-time video stream, an audio track of a recorded video, an audio recording (e.g., music, podcast, spoken word, etc.), or the like. The processing system 104 may also perform other operations of the electronic system 101 as described herein.

Figure 2A:
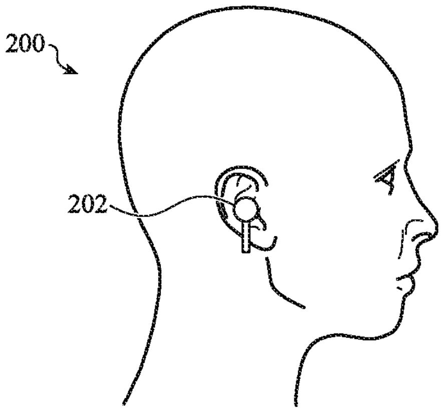
FIGS. 2A-2B depict an example head-mounted haptic accessory.
Figure 2B:
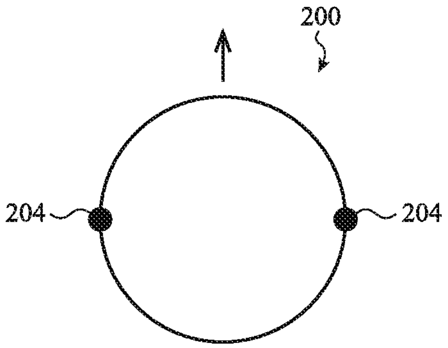

FIG. 2A is a side view of a user 200 wearing a head-mounted haptic accessory that includes earbuds 202 each having a haptic actuator positioned within an earbud body. FIG. 2B is a schematic top view of the user 200, illustrating how the earbuds 202 define an array of haptic actuation points 204 on the head of the user 200. Because the earbuds 202 (or another pair of headphones or head-worn audio device) are positioned on or in the ear of the user 200, the haptic actuation points are on opposite lateral sides of the user's head.

Figure 3A:
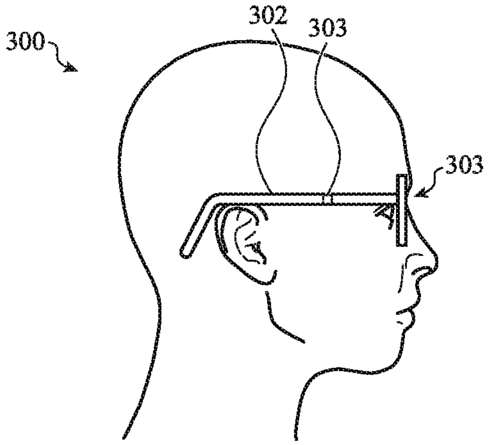
FIGS. 3A-3B depict another example head-mounted haptic accessory.
Figure 3B:
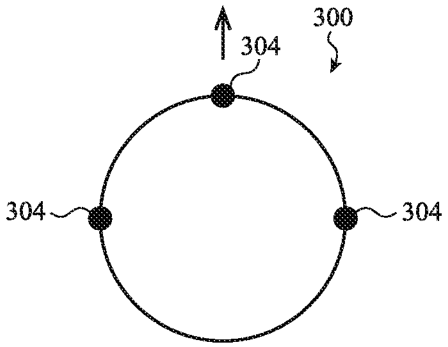

FIG. 3A is a side view of a user 300 wearing a head-mounted haptic accessory embodied as a pair of glasses 302 that includes haptic actuators 303 positioned at various locations on the glasses 302. For example, an actuator may be positioned on each temple piece, and another may be positioned on a nose bridge segment of the glasses 302. FIG. 3B is a schematic top view of the user 300, illustrating how the glasses 302, and more particularly the actuators 303 of the glasses 302, define an array of haptic actuation points 304 on the head of the user 300. As shown in FIG. 3B, two haptic actuation points are positioned on opposite lateral sides of the head, and one is positioned on the center of the head (e.g., on or near the bridge of the user's nose). In some cases, more or fewer haptic actuators may be included in the glasses 302. For example, the actuator on the nose bridge segment may omitted.

Figure 4A:
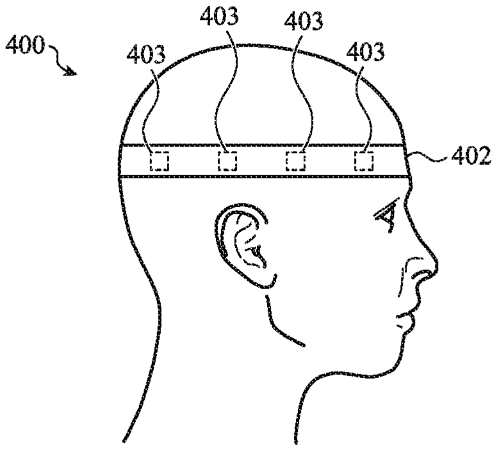
FIGS. 4A-4B depict another example head-mounted haptic accessory.
Figure 4B:
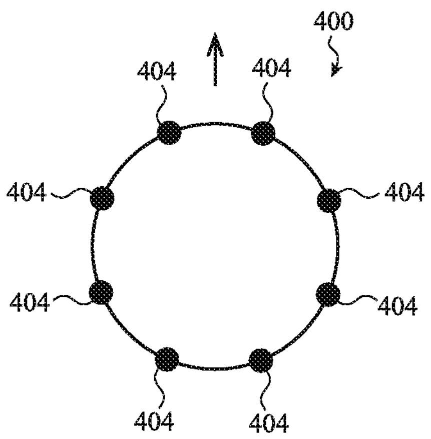

FIG. 4A is a side view of a user 400 wearing a head-mounted haptic accessory embodied as a headband 402 that includes haptic actuators 403 positioned at various locations along the headband 402. For example, eight actuators 403 may be positioned at various locations around the headband 402, though more or fewer actuators 403 are also contemplated. FIG. 4B is a schematic top view of the user 400, illustrating how the headband 402, and more particularly the actuators 403 of the headband 402, define an array of haptic actuation points 404 on the head of the user 400. As shown in FIG. 4B, the actuation points 404 are positioned equidistantly around the circumference of the user's head, though this is merely one example arrangement. Further, while FIGS. 4A-4B illustrate the head-mounted haptic accessory as a headband, this embodiment may equally represent any head-worn clothing, device, or accessory that wraps around some or all of the user's head, including but not limited to hats, caps, head-mounted displays, hoods, visors, helmets, and the like.

The arrays of haptic actuators shown and described with respect to FIGS. 2A-4B illustrate examples in which the haptic actuators define a radial array of actuators that at least partially encircle or surround a user's head. The radial array configurations may help convey directionality to the user via the haptic outputs. For example, the haptic actuators of the various head-mounted haptic accessories may be initiated in accordance with an actuation pattern that is recognizable as indicating a particular direction to a user. Such directional haptic outputs can be used to direct a user's attention in a particular direction, such as towards a virtual position of a virtual audio source. By directing the user's attention in this way, the user may be subtly directed to move his or her head to face the position of the virtual audio source, which may increase engagement of the wearer with the audio source, especially where multiple audio sources (and thus multiple positions) are active. Additional details of example actuation patterns and particular use cases for producing the actuation patterns are described herein.

Figure 5:
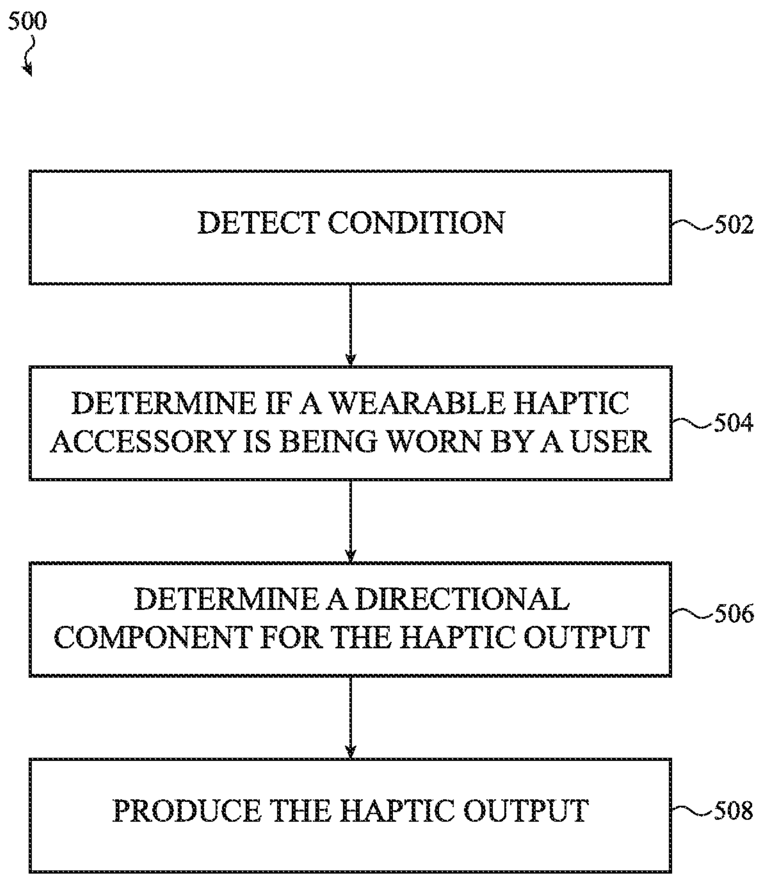
FIG. 5 depicts an example process for producing a haptic output.

FIG. 5 is an example flow chart of a method 500 of operating an electronic system that produces directional haptic outputs, as described herein. At operation 502, a condition is detected (e.g., by the electronic system 101). The condition may be any suitable condition that is a triggering event for initiating a haptic output (e.g., a directional haptic output) via a wearable haptic device (e.g., a head-mounted haptic accessory 102). For example, detecting the condition may include or correspond to detecting a presence of an audio source in an audio signal, where the audio source may be associated with a virtual position relative to the user. More particularly, as described in greater detail with respect to FIGS. 10A-10B, if the user is engaged in a conference call with multiple participants, each participant may have an assigned virtual location relative to the user. In this case, detecting the condition may include detecting that one of the participants is speaking or otherwise producing audio. Detecting the condition may also include detecting whether a characteristic of a signal, including but not limited to a volume or amplitude of an audio output corresponding to an audio signal, has satisfied a threshold value. For example, in the context of a multi-party conference call, detecting the condition may include detecting that an audio output associated with one of the participants has satisfied a threshold value (e.g., a threshold volume).

As another example, detecting the condition may include or correspond to detecting a notification indicating that the user has received a message, or that a graphical object (or audio message) has been received or is otherwise available in a virtual environment. As yet another example, detecting the condition may include or correspond to detecting the presence of an interactive object or affordance in a virtual environment. As used herein, an interactive object may correspond to or be associated with a graphical object in a virtual environment and that a user can interact with in a manner beyond mere viewing. For example, a user may be able to select the interactive object, virtually manipulate the interactive object, provide inputs to the interactive object, or the like. As one specific example, where the virtual environment corresponds to a gaming application, an interactive object may be an item that the user may select and add to his or her inventory. As another specific example, where the virtual environment corresponds to a word processing application, the interactive object may be a selectable icon that controls a program setting of the application.

At operation 504, it is determined whether a wearable haptic accessory is being worn by a user. For example, a processing system 104 may detect whether a head-mounted haptic accessory 102 is being worn by a user. In some cases, the head-mounted haptic accessory 102 may determine whether it is being worn by either sensing the presence of the user (using, for example, a proximity sensor), or by inferring from an orientation or motion of the head-mounted haptic accessory 102 that it is being worn (using, for example, an accelerometer or magnetometer or motion sensor). The head-mounted haptic accessory 102 may report to the processing system 104 whether it is or is not being worn. If the processing system 104 cannot communicate with a head-mounted haptic accessory, the processing system 104 may assume that no head-mounted haptic accessory is available.

If it is determined that a head-mounted haptic accessory is being worn by a user, a directional component for a haptic output may be determined at operation 506. The directional component for the haptic output may correspond to a direction that a user must turn his or her head or body in order to be facing a desired position or location. For example, if a user is not facing a virtual position or location of an audio source, the directional component for the haptic output may be a direction that the user must turn his or her head or body in order to face the virtual position or location. In some cases, the determination of the directional component for the haptic output may be based at least in part on an orientation of the wearer of the head-mounted haptic accessory. Such information may be determined by the head-mounted haptic accessory, such as via sensors (e.g., accelerometers, magnetometers, gyroscopes, orientation sensors) incorporated with the head-mounted haptic accessory. Such information may be reported to the processing system 104, which may then determine the directional component. Determining the directional component may also include determining an actuation pattern for an array of actuators on the head-mounted haptic accessory. For example, if the directional component indicates that the user needs to turn his or her head 30 degrees to the left, the pattern may cause the haptic actuators to fire in a sequence that moves across the user's body from right to left.

At operation 508, in response to detecting the condition and determining the directional component (e.g., determining the actuation pattern), determining that the haptic accessory is being worn by the user, and determining the directional component for the haptic output, the haptic output may be produced. As described herein, this may include sending a signal to the haptic accessory that will cause the haptic accessory to produce the haptic output in accordance with the directional component. As described in greater detail herein, the haptic output may produce a sensation that has an identifiable directional component or that otherwise suggests a particular direction to a user. For example, a sequence of haptic outputs may travel around a user's head from left to right, indicating that the user should direct his or her orientation along that direction (e.g., to the right). As another example, a haptic output may produce a tugging or pulling sensation that suggests the direction that a user should move (e.g., rotate) his or her head.

In some cases, a signal defining or containing the actuation may be sent to the haptic accessory from the processing system. In other cases, data defining haptic patterns is stored in the haptic accessory, and the processing system sends a message (and optionally an identifier of a particular actuation pattern) to the haptic accessory that causes the haptic accessory to produce the haptic output.

FIG. 5 describes a general framework for the operation of an electronic system as described herein. It will be understood that certain operations described herein may correspond to operations explicitly described with respect to FIG. 5, while other operations may be included instead of or in addition to operations described with respect to FIG. 5.

As described above, haptic outputs delivered via a head-mounted haptic accessory may include a directional component or may otherwise be configured to direct the user's attention along a particular direction. In order to indicate a direction to a user, an actuation pattern or sequence may be used to produce a tactile sensation that suggests a particular direction to the wearer. Actuation patterns where haptic outputs are triggered or produced sequentially (e.g., at different times) may be referred to as a haptic sequence or actuation sequence.

Figure 6A:
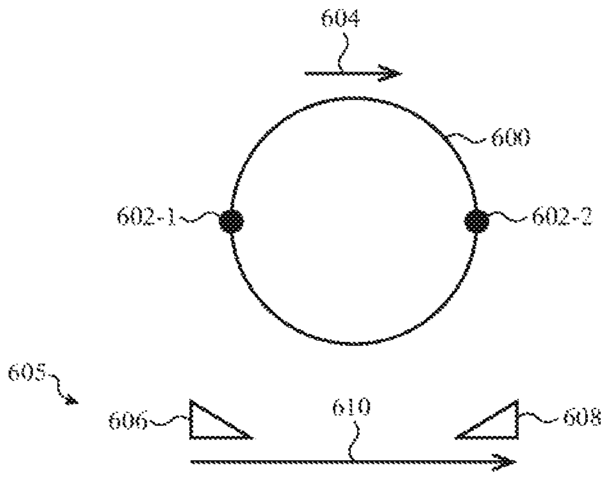
FIG. 6A depicts an example directional haptic output produced by a head-mounted haptic accessory.
Figure 6B:
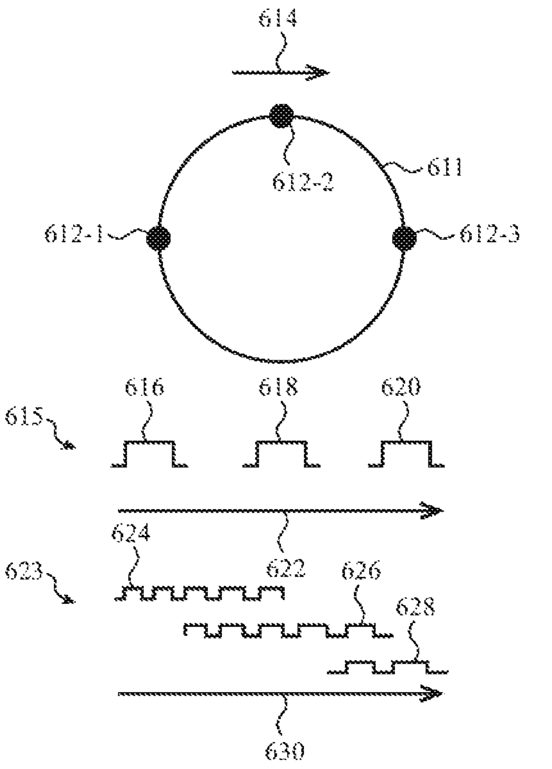
FIG. 6B depicts additional examples of directional haptic outputs produced by a head-mounted haptic accessory.

FIGS. 6A-6B are schematic top views of a user wearing various types of head-mounted haptic accessories, as well as example actuation patterns that may produce the intended tactile sensation. FIG. 6A illustrates a schematic top view of a user 600 having a head-mounted haptic accessory with two actuation points 602-1, 602-2. The head-mounted haptic accessory may correspond to a pair of earbuds or other headphones that are worn on, in, or around the user's ears. Alternatively, the head-mounted haptic accessory may be any device that defines two haptic actuation points.

FIGS. 6A-6B provide an example of how a haptic output may be configured to orient a user toward a virtual objet or direct the user's attention along a particular direction. For example, in order to produce a haptic output to direct the user 600 to turn to the right (indicated by arrow 604), the electronic system may initiate a haptic sequence 605 that causes an actuator associated with the first actuation point 602-1 to produce a haptic output 606 that decreases in intensity over a time span. (Arrow 610 in FIG. 6A indicates a time axis of the actuation sequence.) After, or optionally overlapping with, the first haptic output 606, a haptic actuator associated with the second actuation point 602-2 may produce a haptic output 608 that increases in intensity over a time span. This haptic sequence may produce a tactile sensation that is indicative or suggestive of a right-hand direction, which may signal to the wearer that he or she should turn his or her head to the right.

The intensity of a haptic output may correspond to any suitable characteristic or combination of characteristics of a haptic output that contribute to the perceived intensity of the haptic output. For example, changing an intensity of a haptic output may be achieved by changing an amplitude of a vibration of the haptic actuator, by changing a frequency of a vibration of the haptic actuator, or a combination of these actions. In some cases, higher intensity haptic outputs may be associated with relatively higher amplitudes and relatively lower frequencies, whereas lower intensity haptic outputs may be associated with relatively lower amplitudes and relatively higher frequencies.

FIG. 6B illustrates a schematic top view of a user 611 having a head-mounted haptic accessory with three actuation points 612-1, 612-2, and 612-3. The head-mounted haptic accessory may correspond to a pair of glasses (e.g., the glasses 302, FIG. 3A), a headband (e.g., the headband 402, FIG. 4A), or any other suitable head-mounted haptic accessory.

In order to produce a haptic output that is configured to direct the user's attention along a given direction, and more particularly to direct the user 611 to turn to the right (indicated by arrow 614), the electronic system may initiate an actuation sequence 615. The actuation sequence 615 may cause an actuator associated with the first actuation point 612-1 to produce a first haptic output 616, then cause an actuator associated with the second actuation point 612-2 to produce a second haptic output 618, and then cause an actuator associated with the third actuation point 612-3 to produce a third haptic output 620. (Arrow 622 in FIG. 6A indicates a time axis of the actuation sequence.) The actuation sequence 615 thus produces a series of haptic outputs that move along the user's head from left to right. This haptic sequence may produce a tactile sensation that is indicative or suggestive of a right-hand direction, which may signal to the wearer that he or she should turn his or her head to the right. As shown, the haptic outputs 616, 618, 620 do not overlap, though in some implementations they may overlap.

FIG. 6B also illustrates another example actuation sequence 623 that may be used to direct the user to turn to the right. In particular, the electronic system may cause an actuator associated with the first actuation point 612-1 to produce a first haptic output 624 having a series of haptic outputs having changing (e.g., increasing) duration and/or period. The electronic system may then cause an actuator associated with the second actuation point 612-2 to produce a second haptic output 626 having a series of haptic outputs having changing (e.g., increasing) duration and/or period. The electronic system may then cause an actuator associated with the third actuation point 612-3 to produce a third haptic output 628 having a series of haptic outputs having changing (e.g., increasing) duration and/or period. As shown, the first, second, and third haptic outputs 624, 626, 628 may overlap, thus producing a tactile sensation that continuously transitions around the user's head from left to right. This haptic sequence may produce a tactile sensation that is indicative or suggestive of a right-hand direction, which may signal to the wearer that he or she should turn his or her head to the right.

The haptic outputs shown in FIG. 6B include square waves, though this is merely a representation of example haptic outputs and is not intended to limit the haptic outputs to any particular frequency, duration, amplitude, or the like. In some cases, the square waves of the haptic outputs may correspond to impulses, such as mass movements along a single direction. Thus, the haptic output 624, for example, may be perceived as a series of taps having an increasing duration and occurring at an increasing time interval. In other cases, the square waves of the haptic outputs may correspond to a vibrational output having a duration represented by the length of the square wave. In such cases, the haptic output 624, for example, may be perceived as a series of vibrational outputs having an increasing duration and occurring an at increasing time interval but maintaining a same frequency content.

Directional haptic outputs such as those described with respect to FIGS. 6A-6B may be used to direct a user's attention along a particular direction, such as towards a virtual position of a participant on a conference call, along a path dictated by a navigation application, or the like. In some cases, the haptic outputs are produced a set number of times (e.g., once, twice, etc.), regardless of whether or not the user changes his or her orientation. In other cases, the electronic system monitors the user after and/or during the haptic outputs to determine if the user has directed his or her attention along the target direction. In some cases, a haptic output will be repeated until the user has reoriented himself or herself to a target position and/or orientation, until a maximum limit of haptic outputs is reached (e.g., which may be two, three, four, or another number of haptic outputs).

As used herein, a haptic output may refer to individual haptic events of a single haptic actuator, or a combination of haptic outputs that are used together to convey information or a signal to a user. For example, a haptic output may correspond to a single impulse or tap produced by one haptic actuator (e.g., the haptic output 616, FIG. 6B), or a haptic output that is defined by or includes a haptic pattern (e.g., the actuation sequence 623, FIG. 6B). As used herein, a haptic output that includes a directional component or otherwise produces a tactile sensation that travels along a direction, or that appears to act in a single direction, may be referred to as a directional haptic output.

Figure 7A:
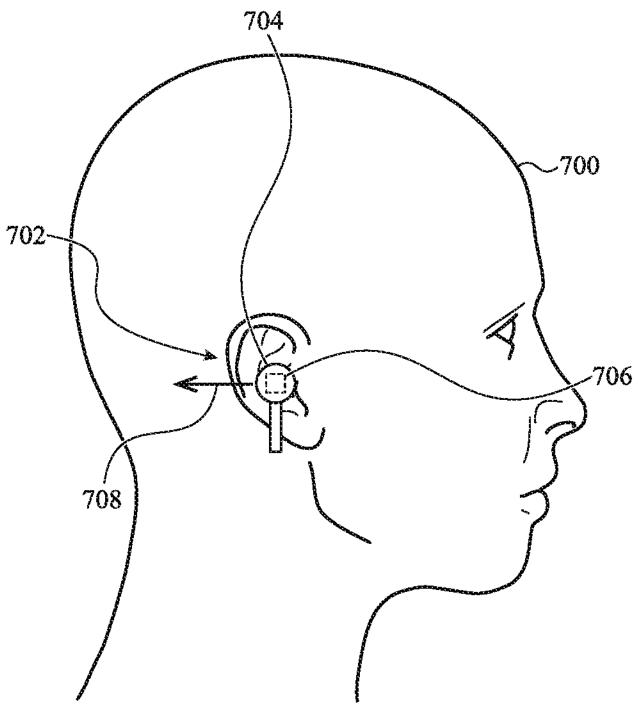
FIGS. 7A-7B depict an additional example directional haptic output produced by a head-mounted haptic accessory.

FIG. 7A illustrates an example earbud 702 that may be part of a head-mounted haptic actuation accessory. The earbud 702 may include an earbud body 704 that is configured to be received at least partially within an ear of a user. As noted above, the earbud 702 may include a speaker positioned within the earbud body and configured to output sound into the user's ear. The earbud 702 may also include a haptic actuator 706 positioned within the earbud body and configured to impart a haptic output to the user's ear. More particularly, the haptic actuator 706 may be configured to impart the haptic output to the user's ear via the interface between the earbud body 704 and the portion of the user's ear canal that the earbud body 704 touches when the earbud 702 is positioned in the user's ear. The haptic actuator 706 may be any suitable type of haptic actuator, such as a linear resonant actuator, piezoelectric actuator, eccentric rotating mass actuator, force impact actuator, or the like.

The earbud 702 (and more particularly the haptic actuator 706) may be communicatively coupled with a processor, which may be onboard the earbud 702 or part of a processing system (e.g., the processing system 104, FIG. 1A). While FIG. 7A shows one earbud 702, it will be understood that the earbud 702 may be one of a pair of earbuds that together form all or part of a head-mounted haptic accessory, and each earbud may have the same components and may be configured to provide the same functionalities (including the components and functionalities described above).

In some cases, the haptic actuator 706 may be configured to produce directional haptic outputs that do not require a pattern of multiple haptic outputs produced by an array of haptic actuators. For example, the haptic actuator 706, which may be linear resonant actuator, may include a linearly translatable mass that is configured to move along an actuation direction that is substantially horizontal when the earbud is worn in the user's ear. This mass may be moved in a manner that produces a directional haptic output. More particularly, the mass may be accelerated along a single direction and then decelerated to produce an impact that acts in a single direction. The mass may then be moved back to a neutral position without producing a significant force in the opposite direction, thus producing a tugging or pushing sensation along a single direction.

Figure 7B:
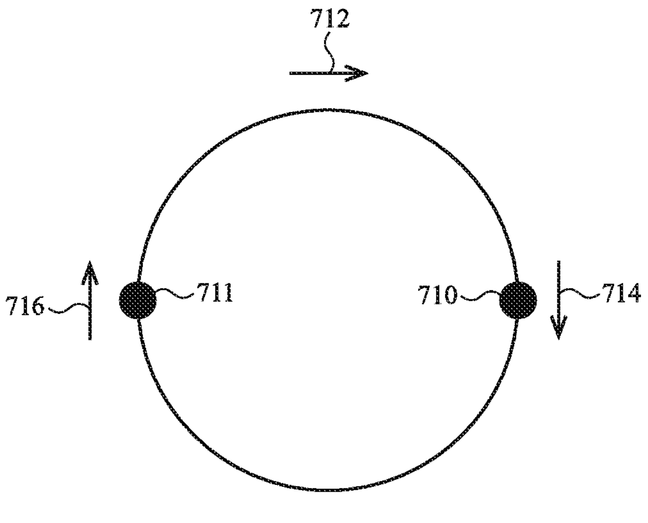

FIG. 7B illustrates a schematic top view of a user wearing earbuds as shown in FIG. 7A, defining haptic actuation points 710, 711 (e.g., in the ear of the user). FIG. 7B illustrates how a haptic output from the haptic actuator 706 may produce a directional haptic output that is configured to direct the user to the right (as indicated by the arrow 712). In particular, the mass of the haptic actuator 706 may be moved in direction indicated by arrow 708 in FIG. 7A to produce an impulse acting along a horizontal direction. This may cause the earbud 702 to impart a reorientation force 714 on the user via the actuation point 710, where the reorientation force 714 acts (or is perceived by the user to act) only in a single direction. The reorientation force 714 may in fact be perceived as a tap or tug on the user's ear in a direction that corresponds to the desired orientation change of the user. For example, the reorientation force may direct the user's attention to the left or to the right along a horizontal plane.

A directional haptic output as described with respect to FIG. 7B may be produced with only a single earbud and/or single haptic actuator. In some cases, however, the effect may be enhanced by using the other earbud (e.g., at the haptic actuation point 711) to produce a reorientation force 716 acting in the opposite direction as the force 714. While this force may be produced along an opposite direction, it would indicate the same rotational or directional component as the force 714, and thus would suggest the same type of reorientation motion to the user. The reorientation forces 714, 716 may be simultaneous, overlapping, or they may be produced at different times (e.g., non-overlapping).

The earbud(s) described with respect to FIG. 7A may be used to produce the haptic outputs described with respect to FIG. 7B, or any other suitable type of haptic output. For example, the earbuds may be used to produce directional haptic outputs using the techniques described with respect to FIGS. 6A-6B.

Figure 8:
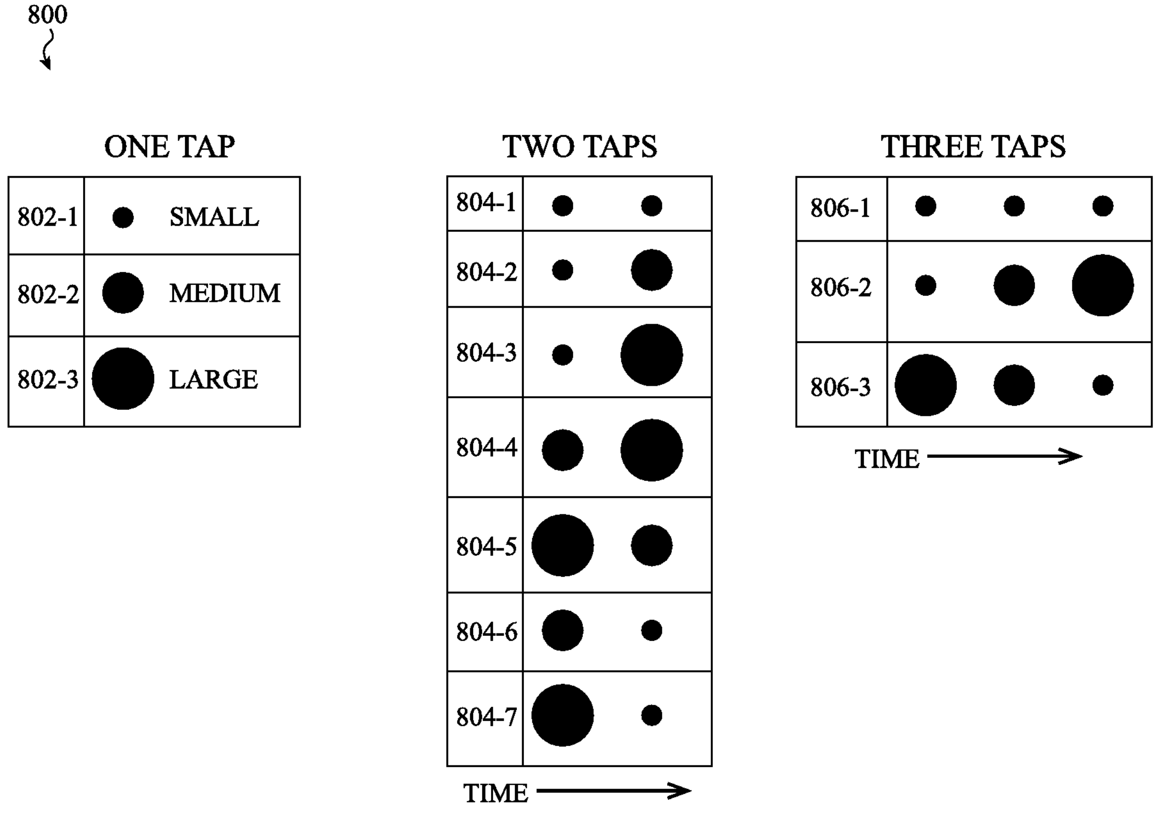
FIG. 8 depicts an example haptic output scheme.

In some cases, in addition to or instead of directional outputs, a head-mounted haptic accessory may be used to produce non-directional haptic outputs. In some cases, a user may only be able to differentiate a limited number of different haptic outputs via their head. Accordingly, a haptic output scheme that includes a limited number of haptic outputs may be used with head-mounted haptic accessories. FIG. 8 illustrates one example haptic output scheme 800. The scheme may include three haptic syllables 802-1-802-3 that may be combined to produce larger haptic words 804-1-804-7 and 806-1-806-3. The haptic syllables may include a low-intensity syllable 802-1, a medium-intensity syllable 802-2, and a high-intensity syllable 802-3. The intensity of the syllable may correspond to any suitable property or combination of properties of a haptic output. For example, if all of the haptic syllables are vibrations of the same frequency, the intensity may correspond to the amplitude of the vibrations. Other combinations of haptic properties may also be used to create syllables of varying intensity. For example, lower frequencies may be used to produce the higher-intensity haptic syllables. Further, the haptic syllables 802 may have multiple different properties. For example, they each may have a unique frequency and a unique amplitude and a unique duration.

The haptic syllables 802 may also be combined to form haptic words 804-1-804-7 (each including two haptic syllables) and haptic words 806-1-806-3 (each including three haptic syllables). In some cases, each haptic syllable (whether used alone or in haptic words) may be produced by all haptic actuators of a head-mounted haptic accessory simultaneously. For example, when the haptic word 804-3 is produced by the headband 402 (FIG. 4A), all of the actuators 403 may simultaneously produce the low-intensity haptic syllable 802-1, and subsequently all actuators may produce the high-intensity haptic syllable 802-3. This may help differentiate the haptic words 804 and 806 from directional haptic outputs. (Directional haptic outputs as described above may also be considered part of the haptic output scheme 800.)

In some cases, each haptic word or syllable may have a different meaning or be associated with a different message, alert, or other informational content. For example, different haptic words may be associated with different applications on a user's smartphone or computer. Thus, the user may be able to differentiate messages from an email application (which may always begin with a low-intensity syllable) from those from a calendar application (which may always begin with a high-intensity syllable). Other mappings are also possible. Moreover, in some cases only a subset of the syllables and words in the haptic output scheme 800 is used in any given implementation.

Figure 9:
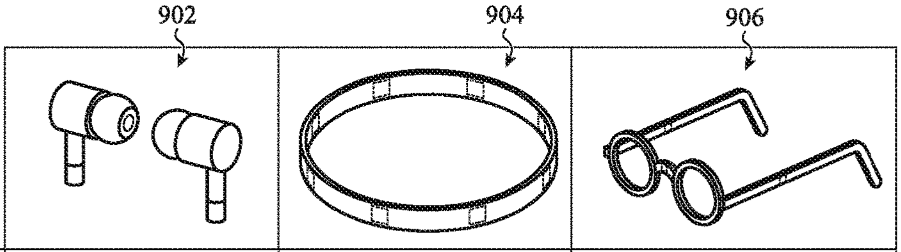
FIG. 9 depicts an example chart showing differences between various head-mounted haptic accessories.

While the directional haptic outputs and the haptic output schemes described herein may all be suitable for use with a head-mounted haptic accessory, each head-mounted haptic accessory may produce slightly different sensations when its haptic actuator(s) are fired. Due to these differences, each type of head-mounted haptic accessory may be associated with a different haptic output scheme that is tailored to the particular properties and/or characteristics of that particular head-mounted haptic accessory. FIG. 9 is a chart showing example differences in how haptics may be perceived when delivered via different types of head-mounted haptic accessories. For example, FIG. 9 depicts the relative intrusiveness of haptic outputs provided by a pair of earbuds 902, a headband 904, and glasses 906. For example, due to the positioning of the earbuds 902 directly in a user's ear, haptic outputs from the earbuds 902 may be relatively more intrusive than those produced by the headband 904 or the glasses 906. As used herein, intrusiveness may refer to the subjective annoyance, irritation, distraction, or other negative impression of a haptic output. For example, an oscillation having a high amplitude and duration that is felt within a user's ear may be considered highly intrusive, whereas that same physical haptic output may be found to be less intrusive and potentially even too subtle when delivered via glasses.

Due to the differences in intrusiveness of haptic outputs, haptic schemes for the various head-mounted haptic accessories may have different properties. FIG. 9, for example, shows each head-mounted haptic accessory 902, 904, and 906 using a different haptic scheme, with each scheme using haptic outputs with different durations. More particularly, the haptic accessory that may be considered to have the greatest intrusiveness may use haptic outputs of a shorter duration, while the haptic accessories with lower intrusiveness may use haptic outputs of a greater duration. This is merely one example property that may differ between various haptic schemes, and other properties and/or characteristics of the haptic outputs may also vary between the schemes to accommodate for the differences in the head-mounted haptic accessories. For example, each haptic scheme may use oscillations or outputs having different frequencies, amplitudes, actuation patterns or sequences, and the like.

In some cases, an electronic system as described herein may be used with different types of head-mounted haptic accessories. Accordingly, a processing system (e.g., the processing system 104) may determine what type of head-mounted haptic accessory is being worn or is otherwise in use, and select a particular haptic scheme based on the type of head-mounted haptic accessory. In some cases, the haptic schemes may be pre-defined and assigned to particular head-mounted haptic accessories. In other cases, a processing system may adjust a base haptic scheme based on the type of head-mounted haptic accessory in use. For example, the base scheme may correspond to haptic outputs of the shortest available duration. If earbuds are determined to be in use, the base haptic scheme may be used without modification. If the headband is in use, the base haptic scheme may be modified to have longer-duration haptic outputs. And if the glasses are determined to be in use, the base haptic scheme may be modified to have even longer-duration haptic outputs. Other modifications may be employed depending on the duration of the haptic outputs in the base scheme (e.g., the modifications may increase or decrease the durations of the haptic outputs in the base scheme, in accordance with the principles described herein and shown in FIG. 9).

Various types of directional haptic outputs are described above. Directional haptic outputs may be configured to direct a user's attention along a direction. This functionality may be used in various different contexts and for various different purposes in order to enhance the user's experience. Several example use cases for directional haptic outputs are described herein with respect to FIGS. 10A-10B and 12A-12B. It will be understood that these use cases are not exhaustive, and directional haptic outputs described herein may be used in other contexts and in conjunction with other applications, interactions, use cases, devices, and so forth. Moreover, while these use cases are shown using earbuds as the head-mounted haptic accessory, it will be understood that any other suitable head-mounted haptic accessory may be used instead of or in addition to the earbuds.

Figure 10A:
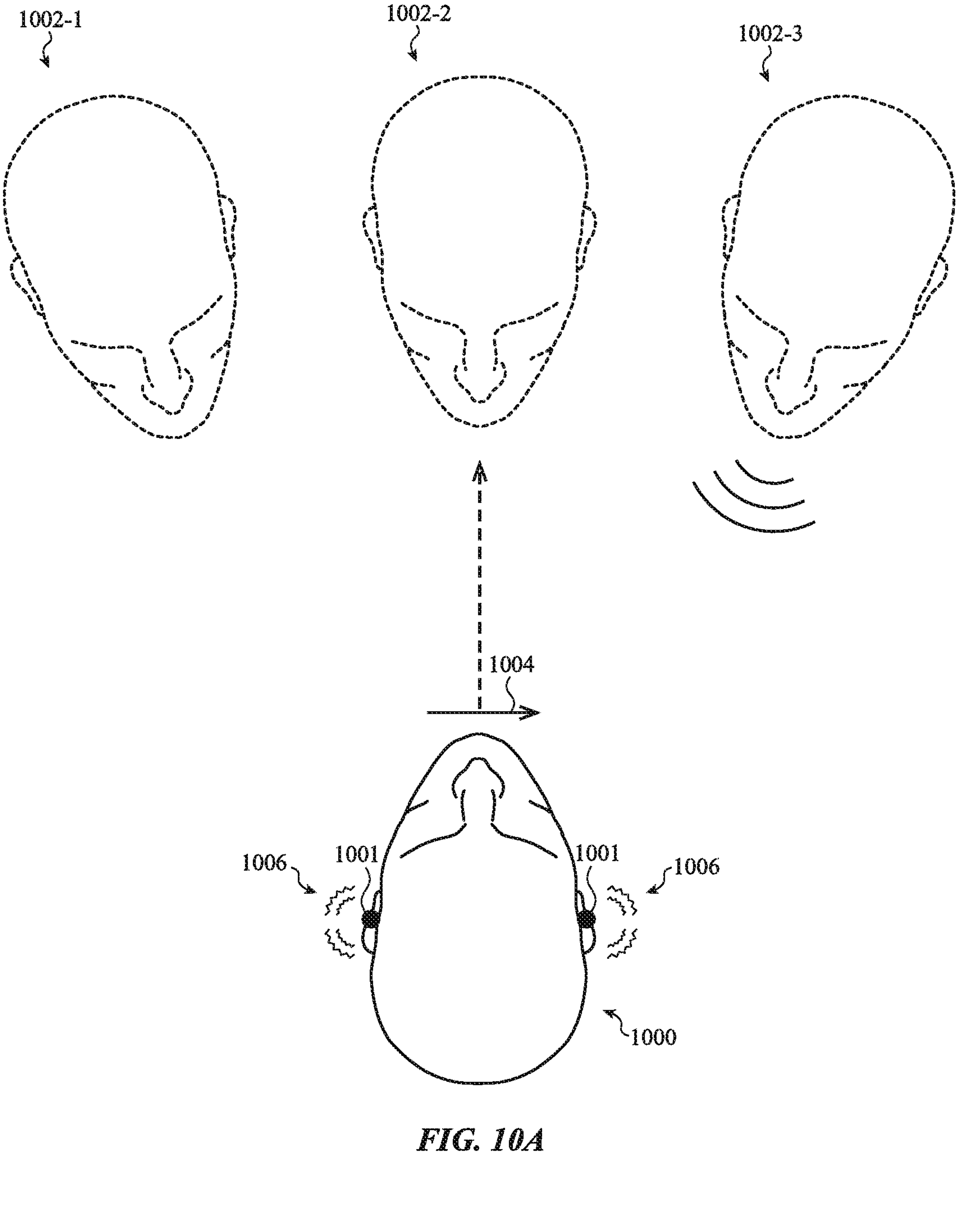
FIGS. 10A-10B depict participants in a teleconference.
Figure 10B:
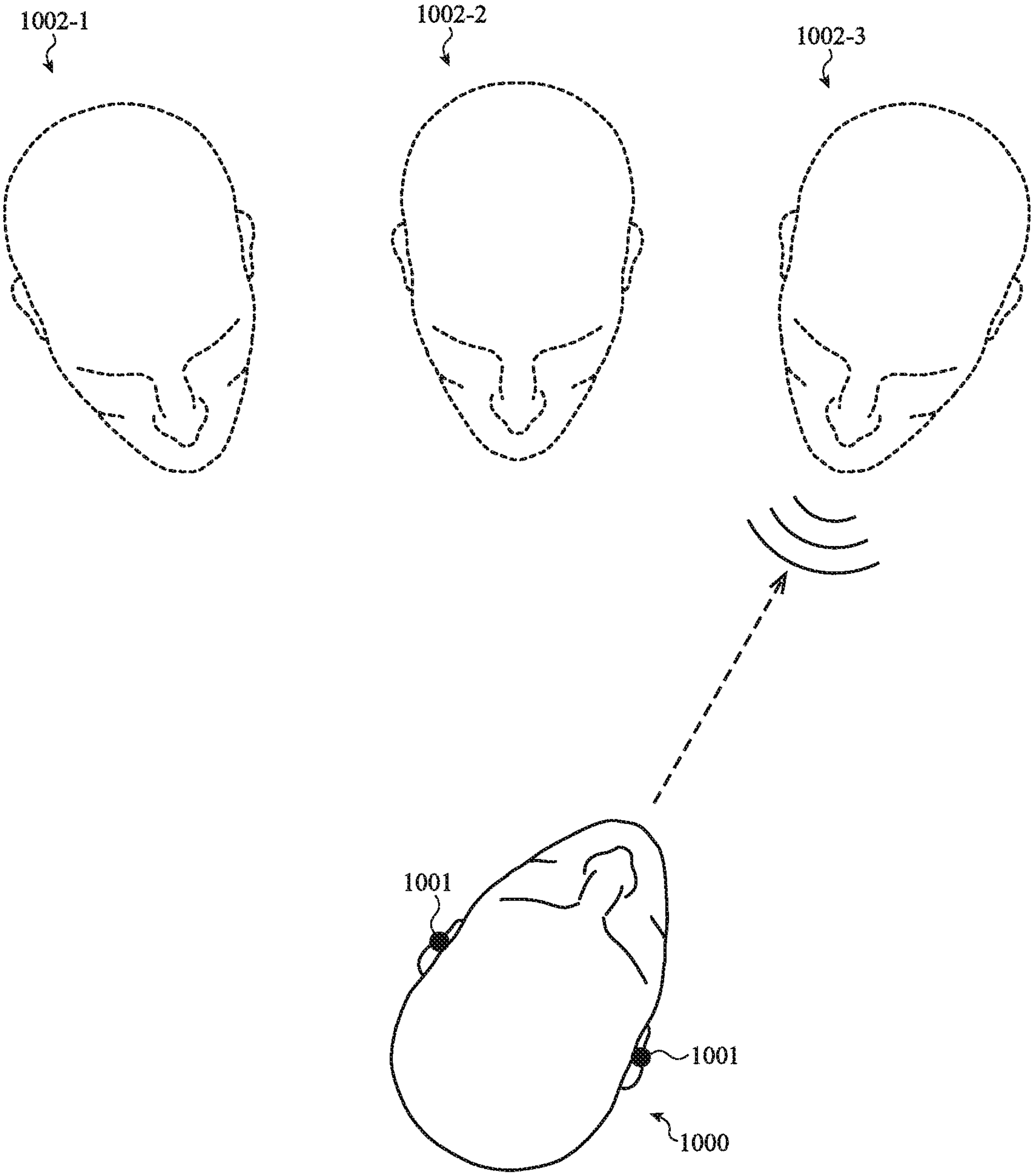

FIG. 10A-10B illustrate an example use case in which a directional haptic output is used to direct a user's attention to a particular audio source in the context of a teleconference. For example, a user 1000 may be participating in a teleconference with multiple participants, 1002-1, 1002-2, and 1002-3 (collectively referred to as participants 1002). The teleconference may be facilitated via telecommunications devices and associated networks, communication protocols, and the like.

The user 1000 may receive teleconference audio (including audio originating from the participants 1002) via earbuds 1001. The earbuds 1001 may be communicatively connected to another device (e.g., the processing system 104, FIG. 1A) that sends the audio to the earbuds 1001, receives audio from the user 1000, transmits the audio from the user 1000 to the participants 1002, and generally facilitates communications with the participants 1002.

The participants 1002 may each be assigned a respective virtual position relative to the user 1000 (e.g., a radial orientation relative to the user and/or the user's orientation and optionally a distance from the user), as represented by the arrangement of participants 1002 and the user 1000 in FIGS. 10A-10B. When it is detected that one of the participants 1002-3 is speaking, the earbuds 1001 may produce a directional haptic output 1006 that is configured to direct the user's attention to the virtual position of the participant 1002-3 from which the audio is originating. For example, a directional haptic output as described herein may be produced via the earbuds 1001 to produce a directional sensation that will suggest that the user 1000 reorient his or her head or body to face the participant 1002-3 (e.g., a left-to-right sensation, indicated by arrow 1004, or any other suitable haptic output that suggests a left-to-right reorientation). FIG. 10B illustrates the user 1000 after his or her orientation is aligned with the virtual position of the audio source (the participant 1002-3).

A system may determine the participant 1002 from which an audio source is originating (e.g., which participant is speaking or active) based on any suitable information or data. For example, in some cases, the participant 1002 to whom attention is directed may be the only participant who is speaking, or the first participant to begin speaking after a pause, or the participant who is speaking loudest, or the participant who has been addressed with a question, or the participant to whom other users or participants are already looking at. As one particular example of the last case, in a teleconference with four participants, if two participants direct their attention to a third participant (e.g., by looking in the direction of the third participant's virtual position), a directional haptic output may be provided to the fourth participant to direct his or her attention to the third participant (e.g., to the third participant's virtual position).

As shown, the haptic output 1006 is not active in FIG. 10B. This may be due to the earbuds 1001 (or other device or sensor) determining that the user's orientation is aligned with the virtual position of the audio source. For example, in some cases the haptic output 1006 may continue (e.g., either continuously or repeatedly) until it is determined that the user is facing or oriented towards the desired position. In other cases, the haptic output 1006 is produced once or a set number of times, regardless of the user's orientation or change in orientation. The latter case may occur when position or orientation information is not available or is not being captured.

Figure 11:
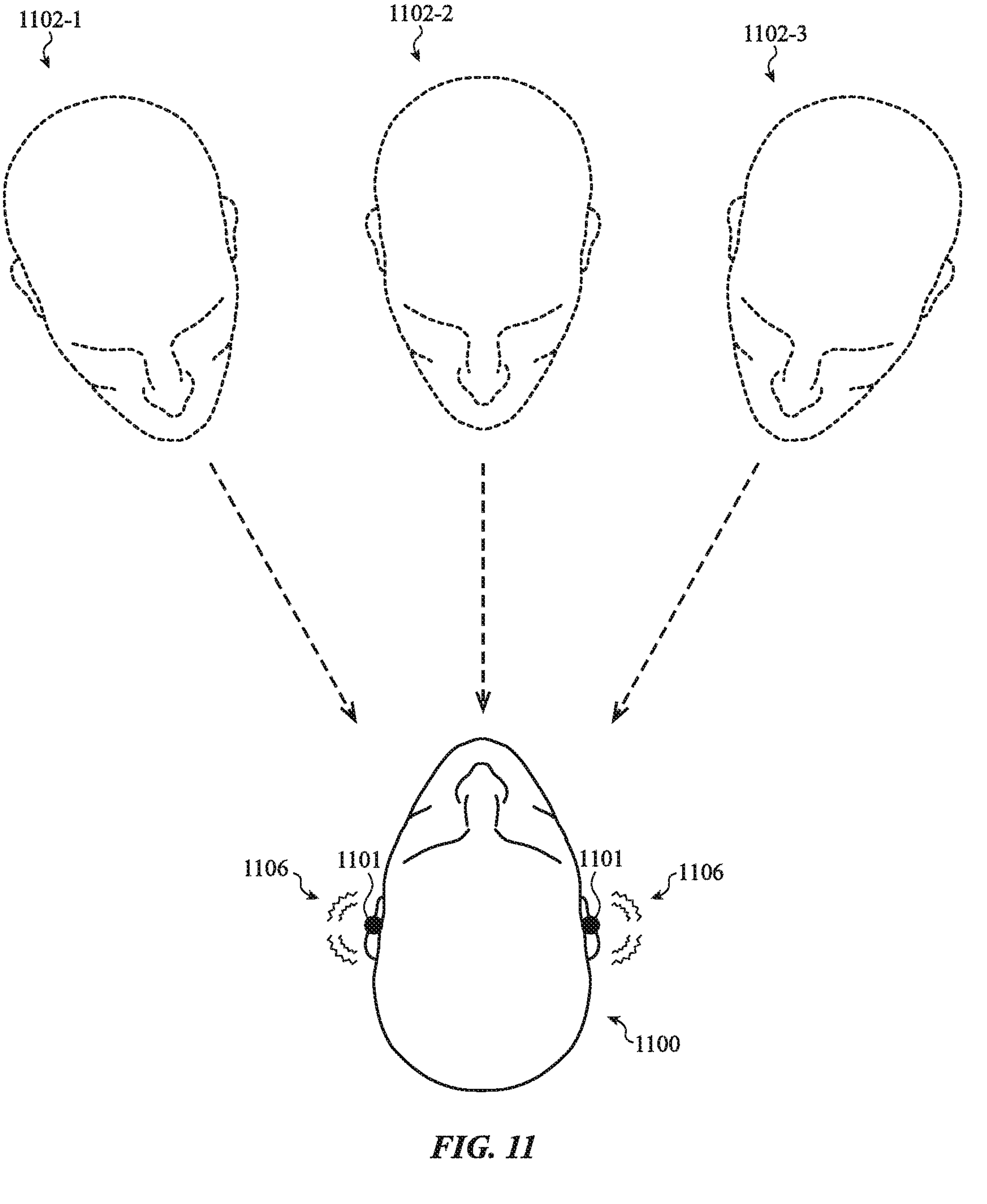
FIG. 11 depicts participants in a teleconference.

Haptic outputs may also be used in the context of a teleconference to indicate to the user that other participants have directed their attention to the user. FIG. 11 illustrates an example teleconference that includes a user 1100 using a head-mounted haptic accessory 11101 (e.g., earbuds) and participants 1102-1, 1102-2, and 1102-3 (collectively referred to as participants 1102). As indicated by the dashed arrows, all of the participants 1102 have directed their attention to the user. Determining when and whether the participants 1102 have directed their attention to the user may be performed in any suitable way. For example, the participants 1102 may be associated with sensors (which may be incorporated in a head-mounted haptic accessory) that can determine whether or not the participants 1102 are facing or otherwise oriented towards a virtual position associated with the user 1100. Such sensor may include gaze detection sensors, accelerometers, proximity sensors, gyroscopes, motion sensors, or the like. In other examples, the participants 1102 may manually indicate that they are focused on the user 1100, such as by clicking on a graphic representing the user 1100 in a graphical user interface associated with the teleconference.

A processing system associated with the user 1100 may detect or receive an indication that attention is focused on the user 1100 or that the user 1100 is expected to speak and, in response, initiate a haptic output 1106 via the head-mounted haptic accessory 1101. In this case, the head-mounted haptic accessory may not have a directional component.

The use cases described with respect to FIGS. 10A-11 may be used in conjunction with one another in a teleconference system or context. For example, the user 1100 and the participants 1102 (or a subset thereof) may each have a head-mounted haptic accessory and a system that can determine their orientation and/or focus. Directional haptic outputs may then be used to help direct attention to an active participant, and non-directional haptics may be used to indicate to the active participant that he or she is the focus of the other participants. These haptic outputs may all be provided via head-mounted haptic accessories and using haptic outputs as described herein.

Another context in which directional and other haptic outputs delivered via a head-mounted haptic accessory includes virtual-, augmented-, and/or mixed-reality environments. As used herein, the term virtual reality will be used to refer to virtual-reality, mixed-reality, and augmented-reality environments or contexts. In some cases, virtual-reality environments may be presented to a user via a head-mounted display, glasses, or other suitable viewing device(s).

Figure 12A:
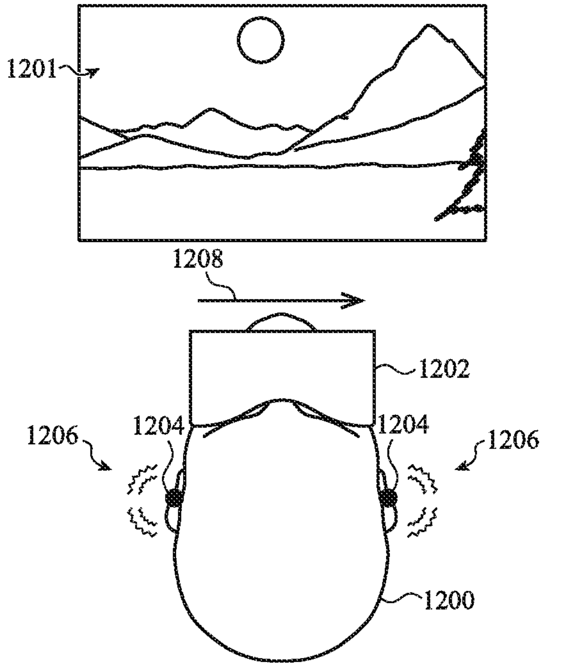
FIGS. 12A-12B depict a user engaged in a virtual-reality environment.
Figure 12B:
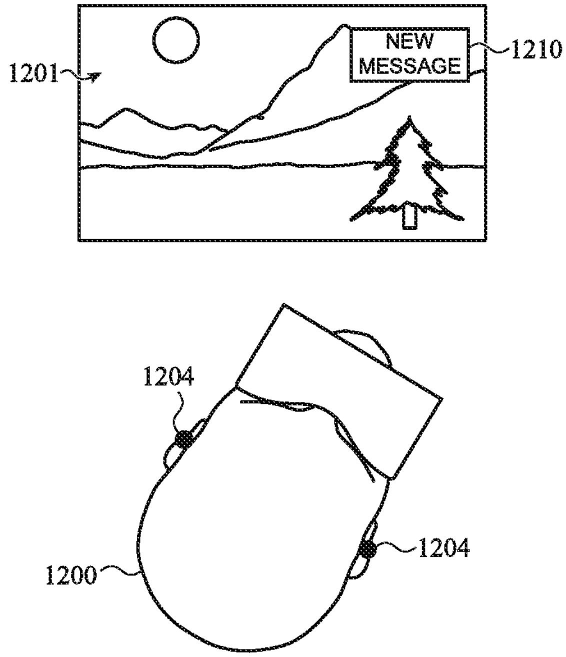

FIGS. 12A-12B illustrate an example use case in which directional haptic outputs are used to enhance a virtual-reality experience. A user 1200 may be wearing a head-mounted display (HMD) 1202, which may be displaying to the user 1200 a graphical output representing a virtual environment 1201. The user 1200 may also be wearing a head-mounted haptic accessory 1204, shown in FIGS. 12A-12B as earbuds.

While the user is viewing the virtual environment 1201, a notification may be received by the HMD (or any suitable processing system) indicating that a graphical object 1210 (FIG. 12B) is available to be viewed in the virtual environment 1201. The graphical object 1210 may be out of the field of view of the user when the notification is received. For example, as shown in FIG. 12B, the graphical object 1210 may have a virtual position that is to the right of the user's view of the virtual environment 1201. Accordingly, the HMD (or any other suitable processing system) may direct the head-mounted haptic accessory 1204 to initiate a directional haptic output 1206 that is configured to orient the user towards the virtual position of the graphical object 1210 (e.g., to the right, as indicate by arrow 1208). As shown in FIG. 12B, in response to the user 1200 moving his or her head in the direction indicated by the directional haptic output 1206, the scene of the virtual environment 1201 may be shifted a corresponding distance and direction (e.g., a distance and/or direction that would be expected in response to the reorientation of the user's head). This shift may also bring the graphical object 1210 into the user's field of view, allowing the user 1200 to view and optionally interact with the graphical object 1210. Directional haptic outputs may also or instead be used to direct users' attention to other objects in a virtual environment, such as graphical objects with which a user can interact, sources of audio, or the like.

Head-mounted haptic accessories may also be used to enhance the experience of consuming audio and video content. For example, haptic outputs may be initiated in response to certain audio features in an audio stream, such as loud noises, significant musical notes or passages, sound effects, and the like. In the context of a video stream, haptic outputs may be initiated in response to visual features and/or corresponding audio features that accompany the visual features. For example, haptic outputs may be initiated in response to an object in a video moving in a manner that appears to be in proximity to the viewer. Directional haptic outputs may also be used in these contexts to enhance the listening and/or viewing experience. For example, different instruments in a musical work may be assigned different virtual positions relative to a user, and when the user moves relative to the instruments, the haptic output may change based on the relative position of the user to the various instruments. These and other examples of integrating haptic outputs with audio and/or video content are described with respect to FIGS. 13A-14B.

Figure 13A:
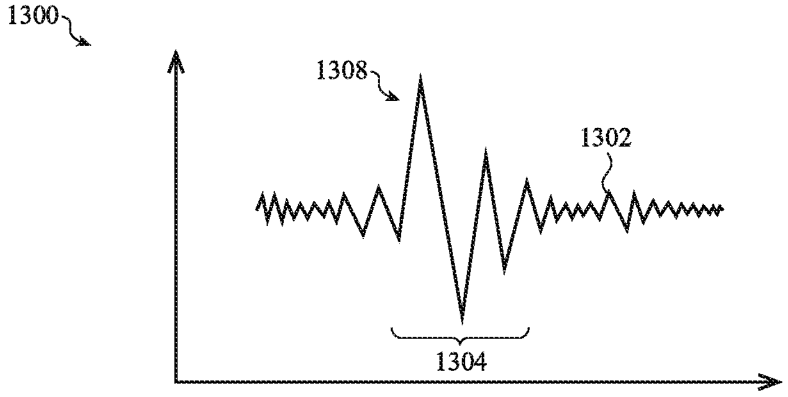
FIG. 13A depicts an example audio feature in audio data.
Figure 13B:
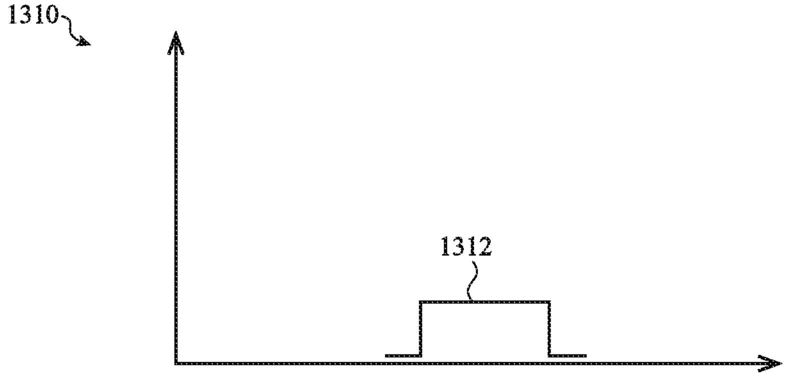
FIG. 13B depicts an example haptic output associated with the audio feature of FIG. 13A.

FIGS. 13A-13B depict an example feature identification technique that may be used to integrate haptic outputs with audio content. FIG. 13A illustrates a plot 1300 representing audio data 1302 (e.g., a portion of a musical track, podcast, video soundtrack, or the like). The audio data 1302 includes an audio feature 1304. The audio feature 1304 may be an audibly distinct portion of the audio data 1302. For example, the audio feature 1304 may be a portion of the audio data 1302 representing a distinctive or a relatively louder note or sound, such as a drum beat, cymbal crash, isolated guitar chord or note, or the like. In some cases, the audio feature 1304 may be determined by analyzing the audio data to identify portions of the audio data that satisfy a threshold condition. The threshold condition may be any suitable threshold condition, and different conditions may be used for different audio data. For example, a threshold condition used to identify audio features in musical work may be different from a threshold condition used to identify audio features in a soundtrack of a video.

In one example, the threshold condition may be based on the absolute volume or amplitude of the sound in the audio data. In this case, any sound at or above the absolute volume or amplitude threshold may be identified as an audio feature. In another example, the threshold condition may be based on a rate of change of volume or amplitude of the sound in the audio data. As yet another example, the threshold condition may be based on the frequency of the sound in the audio data. In this case, any sound above (or below) a certain frequency value, or a sound within a target frequency range (e.g., within a frequency range corresponding to a particular instrument), may be identified as an audio feature, and low-, high-, and/or band-pass filters may be used to identify the audio features. These or other threshold conditions may be combined to identify audio features. For example, the threshold condition may be any sound at or below a certain frequency and above a certain amplitude. Other threshold conditions are also contemplated.

In some cases, once an audio feature is identified, or as part of the process of identifying the audio feature, a triggering event of the audio feature may be detected. The triggering event may correspond to or indicate a time that audio feature begins. For example, detecting the triggering event may include determining that a rate of change of an amplitude of the audio signal and/or the audio output satisfies a threshold. This may correspond to the rapid increase in volume, relative to other sounds in the audio data, that accompanies the start of an aurally distinct sound, such as a drumbeat, a bass note, a guitar chord, a sung note, or the like. The triggering event of an audio feature may be used to signify the beginning of the audio feature, and may be used to determine when to initiate a haptic output that is coordinated with the audio feature.

A duration or end point of the audio feature may also be determined. For example, in some cases the end of the audio feature may correspond to a relative change in volume or amplitude of the audio data. In other cases, it may correspond to an elapsed time after the triggering event. Other techniques for identifying the end point may also be used.

Once the audio feature is detected, a characteristic frequency of the audio feature may be determined. The characteristic frequency may be the most prominent (e.g., loudest) frequency or an average frequency of the audio feature. For example, a singer singing an "A" note may produce an audio feature having a characteristic frequency of about 440 Hz. As another example, a bass drum may have a characteristic frequency of about 100 Hz. As yet another example, a guitar chord of A major may have a characteristic frequency of about 440 Hz (even though the chord may include other notes as well).

Once the characteristic frequency has been determined, a haptic output may be provided via a head-mounted haptic accessory, where the haptic output has a haptic frequency that is selected in accordance with the characteristic frequency of the audio feature. For example, the haptic frequency may be the same as the characteristic frequency, or the haptic frequency may be a complementary frequency to the characteristic frequency.

As used herein, a complementary frequency may correspond to a frequency that does not sound discordant when heard in conjunction with the audio feature. More particularly, if an audio feature has a characteristic frequency of 200 Hz, a haptic output having a haptic frequency of 190 Hz may sound grating or discordant. On the other hand, a haptic frequency of 200 Hz or 100 Hz (which may be the same note one octave away from the 200 Hz sound) may sound harmonious or may even be substantially or entirely masked by the audio feature. In some cases, the complementary frequency may be a harmonic of the characteristic frequency (e.g., 2, 3, 4, 5, 6, 7, or 8 times the characteristic frequency, or any other suitable harmonic) or a subharmonic of the characteristic frequency (e.g., ½, ⅓, ¼, ⅕, ⅙, ⅐, or ⅛ of the characteristic frequency, or any other suitable subharmonic).

FIG. 13B illustrates a plot 1310 representing a haptic response of one or more haptic actuators of a head-mounted haptic accessory. The haptic response includes a haptic output 1312, which is produced while the audio feature 1304 is being outputted. In some cases, the haptic output is provided for the full duration of the audio feature, for less than the full duration of the audio feature, or for any other suitable duration. In some cases, the haptic output is provided for a fixed duration after the triggering event of the audio feature (e.g., 0.1 seconds, 0.25 seconds, 0.5 seconds, 1.0 seconds, or any other suitable duration). The experience of hearing the audio feature 1304 while also feeling the haptic output 1312 may produce an enhanced listening experience.

While the haptic output 1312 is shown as a square output, this is merely for illustration, and the haptic output 1312 may have varying haptic content and/or characteristics. For example, the intensity of the haptic output 1312 (which may correspond to various combinations of frequency, amplitude, or other haptic characteristics) may vary as the haptic output 1312 is being produced. As one example, the intensity may taper continuously from a maximum initial value to zero (e.g., to termination of the haptic output). As another example, the intensity of the haptic output 1312 may vary in accordance with the amplitude of the audio feature (e.g., it may rise and fall in sync with the audio feature). As yet another example, the frequency of the haptic output 1312 may vary. More particularly, the frequency of the haptic output 1312 may vary in accordance with a variation in an audio characteristic of the audio feature (e.g., a varying frequency of the audio feature). In this way, an audible component of the haptic output 1312 may not detract from or be discordant with the audio feature, and may even enhance the sound or listening experience of the audio feature.

Identifying audio features in audio data, and associating haptic outputs with the audio features, may also be used for audio data that is associated with video content. For example, audio data associated with a video (such as a soundtrack or audio track for the video) may be analyzed to identify audio features that correspond to video content that may be enhanced by a haptic output. As one specific example, a video may include a scene where a ball is thrown towards the viewer, or in which a truck passes by the viewer, or another scene that includes or is associated with a distinctive sound. Processing the audio data and associating a haptic output in the manner described above may thus result in associating a haptic output with a particular scene or action in the video content. With respect to the examples above, this may result in the viewer feeling a haptic output (e.g., via a head-mounted haptic accessory) when the ball or the truck passes by the viewer. This may provide a sensation that mimics or is suggestive of the tactile or physical sensation that may be experienced when a ball or truck passes a person in real-life. Even if the sensation does not specifically mimic a real-world sensation, it may enhance the viewing experience due to the additional sensations from the haptic output.

Other features and aspects described above with respect to configuring a haptic output for audio content may also apply for video content. For example, the haptic output may be configured to have a complementary frequency to the characteristic frequency of the video's audio feature. Further, the intensity (or other haptic characteristic) of the haptic output may vary in accordance with a characteristic of the audio feature. For example, the intensity of the haptic output may increase along with an increase in the amplitude of the audio feature.

The processes and techniques described with respect to FIGS. 13A-13B may be performed by any suitable device or system. For example, a smartphone, media player, computer, tablet computer, or the like, may process audio data, select and/or configure a haptic output, send audio data to an audio device (e.g., earbuds) for playback, and initiate a haptic output via a head-mounted haptic accessory. The operations of analyzing audio data to identify audio features, select or configure haptic outputs, and to associate the haptic outputs with the audio features (among other possible operations) may be performed in real-time while the audio is being presented, or they may be performed ahead of time and resulting data may be stored for later playback. Further, a device or processing system that sends audio data to an audio device for playback may also send signals to any suitable head-mounted haptic accessory. For example, if a user is wearing earbuds with haptic actuators incorporated therein, a processing system (e.g., a smartphone or laptop computer) may send the audio and haptic data to the earbuds to facilitate playback of the audio and initiation of the haptic outputs. Where a separate audio device and head-mounted haptic accessory are being used, such as a pair of headphones and a separate haptic headband, the processing system may send the audio data to the headphones and send haptic data to the headband.

Figure 14A:
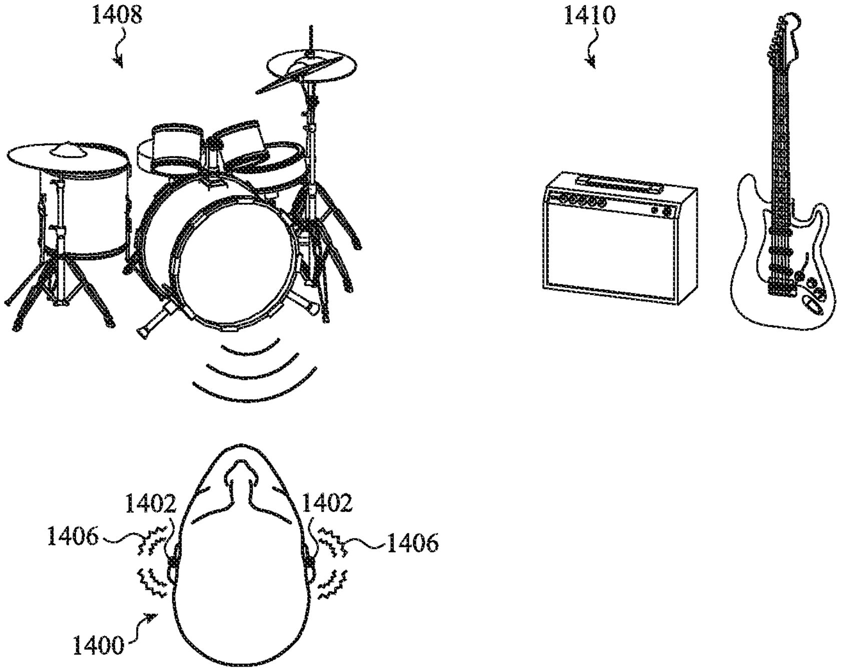
FIGS. 14A-14B depict a spatial arrangement of a user and two audio sources.
Figure 14B:
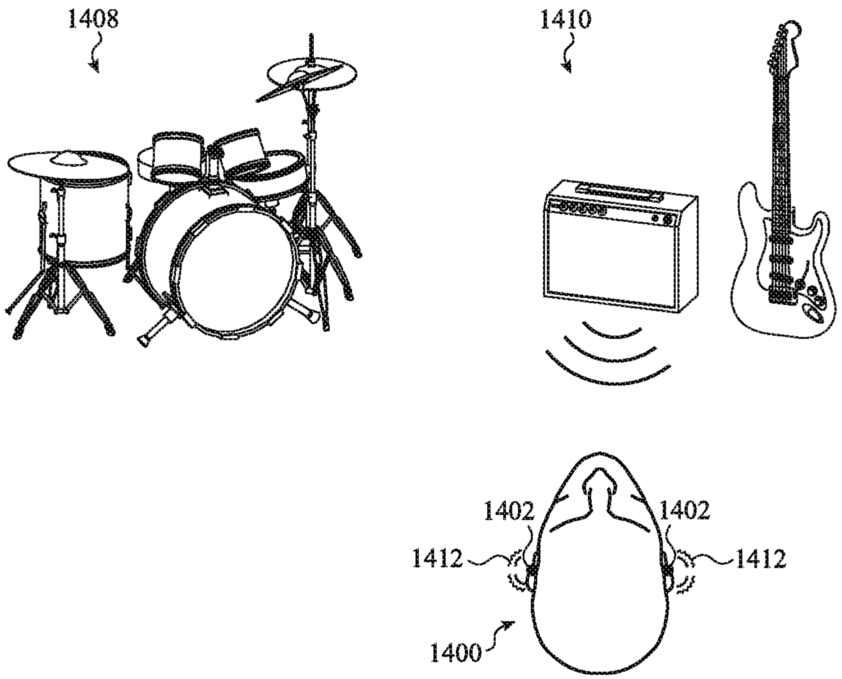

In addition to or instead of initiating a haptic output to correspond to an audio feature, haptic outputs may be varied based on the position or orientation of a user relative to a virtual location of an audio source. FIGS. 14A-14B illustrate one example in which audio sources may be associated with different virtual positions, and in which the relative location of the user to the various audio sources affects the particular haptic output that is produced.

In particular, FIG. 14A shows a user 1400 at a first position relative to a first audio source 1408 and a second audio source 1410. As shown in FIGS. 14A-14B, the first and second audio sources 1408, 1410 correspond to different musical instruments (e.g., a drum kit and a guitar, respectively). While they are described as being different audio sources, the sound associated with the first and second audio sources 1408, 1410 may be part of or contained within common audio data. For example, the first and second audio sources 1408, 1410 may correspond to different portions of a single audio track. As another example, the first and second audio sources 1408, 1410 may correspond to different audio tracks that are played simultaneously to produce a song.

In some cases, a single audio track may be processed to isolate or separate the audio sources 1408, 1410. For example, sounds within a first frequency range (e.g., a frequency range characteristic of a drum set) may be established as the first audio source 1408, and sounds within a second frequency range (e.g., a frequency range characteristic of a guitar) may be established as the second audio source 1410. Other types of audio sources and/or techniques for identifying audio sources may also be used.

The multiple audio sources may be assigned virtual positions. For example, the first and second audio sources 1408, 1410 may be assigned positions that mimic or are similar to the spatial orientation of two musical instruments in a band. The user 1400 may also be assigned a virtual position. FIG. 14A shows the user 1400 at one example position relative to the first and second audio sources 1408, 1410 (e.g., the user 1400 is closer to the first audio source 1408 than the second audio source 1410). When the user 1400 moves in the real-world environment, the user's position relative to the virtual positions of the first and second audio sources 1408, 1410 may change. For example, FIG. 14B shows the user 1400 at another position relative to the first and second audio sources 1408, 1410 (e.g., the user 1400 is closer to the second audio source 1410 than the first audio source). Movements and/or translations of the user 1400 in the real-world environment may be determined by any suitable devices, systems, or sensors, including accelerometers, gyroscopes, cameras, imaging systems, proximity sensors, radar, LIDAR, three-dimensional laser scanning, image capture, or any other suitable devices, systems, or sensors. In some cases, instead of the user 1400 moving in real space, the user's position may be changed virtually. For example, the user 1400 may interact with a device to change his or her position relative to the first and second audio sources 1408, 1410.

As noted above, haptic outputs that correspond to or are otherwise coordinated with the first and second audio sources 1408, 1410 may be outputted to the user 1400 via a head-worn haptic accessory (or any other suitable haptic accessory). For example, haptic outputs may be initiated in response to audio features from the first and second audio sources 1408, 1410. Thus, for example, haptic outputs may be synchronized with the drumbeats, and other haptic outputs may be synchronized with guitar notes or chords. Techniques described above may be used to identify audio features in the first and second audio sources 1408, 1410 and to associate haptic outputs with those features.

Changes in the user's position relative to the first and second audio sources 1408, 1410 (based on the user 1400 moving in the real-world environment or based on a virtual position of the user being changed programmatically without a corresponding movement in the real-world environment) may result in changes in the haptic and/or audio outputs provided to the user. For example, as a user moves away from one audio source, the haptic outputs associated with that audio source may reduce in intensity. FIGS. 14A-14B illustrate such a phenomenon. In particular, in FIG. 14A, the user 1400 is positioned relatively closer to the first audio source 1408 (depicted as a drum set) than the second audio source 1410. A haptic output 1406 and optionally audio corresponding to the first and second audio sources 1408, 1410 may be provided via a head-mounted haptic accessory (depicted as earbuds). The haptic output 1406 may be associated with audio features from the first audio source 1408. When the user 1400 moves further from the first audio source 1408, either in the real-world environment or by changing his or her virtual position, as shown in FIG. 14B, a different haptic output 1412 may be produced. As shown, the haptic output 1412 may be of a lower intensity than the haptic output 1406, representing the increased distance from the first audio source 1408. This may mimic or suggest a real-world experience of moving around relative to various different audio sources such as a drum set. In particular, a person may feel as well as hear the sound from the drum set. Accordingly, moving away from the drum set may attenuate or change the tactile sensations produced by the drum. This same type of experience may be provided by modifying haptic outputs based on the changes in relative position to an audio source.

While FIGS. 14A-14B illustrate an example in which multiple audio sources are used, the same techniques may be used for a single audio source. Also, where multiple audio sources are used, the particular haptic outputs provided to the user may include a mix of haptic outputs associated with the various audio sources. For example, the haptic outputs 1406 and 1412 in FIGS. 14A-14B may include a mix of haptic outputs that are associated with and/or triggered by the audio from both the first and second audio sources 1408, 1410. In some cases, the haptic outputs associated with the audio sources are weighted based on the relative position of the user to the audio sources. For example, with respect to FIGS. 14A-14B, the haptic output 1406 may predominantly include haptic outputs associated with the first audio source 1408, due to the relative proximity of the user 1400 to the first audio source 1408, while the haptic output 1412 may predominantly include haptic outputs associated with the second audio source 1410, due to the relative proximity of the user 1400 to the first audio source 1410 in FIG. 14B.

Further, because the audio sources 1408, 1410 are associated with virtual positions relative to the user, directional haptic outputs may be provided to direct the user's attention towards particular audio sources. For example, a directional haptic output may be used to direct the user's attention to an instrument that is about to perform a solo. When the user moves or reorients himself or herself based on the directional haptic output, aspects of the audio output may also change. For example, the volume of the instrument that the user has turned towards may be increased relative to other instruments. Other audio output manipulations based on changes in the user's position or orientation, as described above, may also be used.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings. For example, while the methods or processes disclosed herein have been described and shown with reference to particular operations performed in a particular order, these operations may be combined, subdivided, or re-ordered to form equivalent methods or processes without departing from the teachings of the present disclosure. Moreover, structures, features, components, materials, steps, processes, or the like, that are described herein with respect to one embodiment may be omitted from that embodiment or incorporated into other embodiments.

What is claimed is:

1. A method of providing a directional haptic output, the method comprising:
- receiving an audio signal having a component originating from an audio source corresponding to a virtual position;
- determining if a head-mounted haptic accessory is being worn by a user, the head-mounted haptic accessory comprising:
  - a first earbud comprising:
    - a first haptic actuator; and
    - a first speaker configured to output a first audio output into a first ear canal of a first ear of the user, the first audio output corresponding to a first portion of a sound associated with the audio signal; and
  - a second earbud comprising:
    - a second haptic actuator; and
    - a second speaker configured to output a second audio output into a second ear canal of a second ear of the user, the second audio output corresponding to a second portion of the sound;
- determining an actuation pattern for the first and the second haptic actuators; and
- in response to determining that the head-mounted haptic accessory is being worn by the user and that the audio signal includes the component originating from the audio source, initiating the actuation pattern to produce a directional haptic output, the directional haptic output configured to indicate the virtual position of the audio source by decreasing a first output intensity of the first haptic actuator over a first portion of a time span beginning at a first time and increasing a second output intensity of the second haptic actuator over a second portion of the time span beginning at a second time, the first time different from the second time.

2. The method of claim 1, wherein:
- the audio signal corresponds to audio of a teleconference having multiple participants;
- the audio source corresponds to a participant of the multiple participants; and
- each respective participant of the multiple participants has a distinct respective virtual position relative to the user.

3. The method of claim 1, wherein:
- the first haptic actuator comprises a first movable mass; and
- initiating the actuation pattern causes the first haptic actuator to move the first movable mass along an actuation direction that is configured to impart a reorientation force on the user.

4. The method of claim 1, further comprising:
- after initiating the actuation pattern, determining an orientation of the user relative to the virtual position of the audio source; and
- increasing a volume of at least one of the first audio output or the second audio output as the orientation of the user becomes aligned with the virtual position of the audio source.

5. The method of claim 1, further comprising detecting a notification associated with a graphical object, wherein:
- the virtual position is a first virtual position;
- the actuation pattern is a first actuation pattern;
- the directional haptic output is a first directional haptic output;
- the graphical object has a second virtual position presented to the user in a graphical user interface;
- the second virtual position is associated with a second actuation pattern, the second actuation pattern producing a second directional haptic output; and
- the second directional haptic output is configured to indicate the second virtual position of the graphical object.

6. The method of claim 1, further comprising detecting an interactive object in a virtual environment presented to the user in a graphical user interface, wherein:
- the virtual position is a first virtual position;
- the actuation pattern is a first actuation pattern;
- the directional haptic output is a first directional haptic output;
- the interactive object has a second virtual position within the virtual environment;
- the second virtual position is associated with a second actuation pattern, the second actuation pattern producing a second directional haptic output; and
- the second directional haptic output is configured to indicate the second virtual position of the interactive object.

7. An electronic system comprising:
- a first earbud comprising:
  - a first earbud body configured to be received at least partially within a first ear of a user;
  - a first speaker positioned within the first earbud body and configured to produce a first audio output, the first audio output comprising a first portion of a sound associated with an audio source corresponding to a virtual position; and
  - a first haptic actuator positioned within the first earbud body and configured to impart a first portion of a directional haptic output to the first ear, the first portion of the directional haptic output configured to indicate the virtual position of the audio source by decreasing in intensity over a first portion of a time span, the first portion of the time span beginning at a first time; and
- a second earbud comprising:
  - a second earbud body configured to be received at least partially within a second ear of the user;

a second speaker positioned within the second earbud body and configured to produce a second audio output, the second audio output comprising a second portion of the sound; and a second haptic actuator positioned within the second earbud body and configured to impart a second portion of the directional haptic output to the second ear, the second portion of the directional haptic output configured to indicate the virtual position of the audio source by increasing in intensity over a second portion of the time span, the second portion of the time span beginning at a second time different from the first time.

8. The electronic system of claim 7, wherein:

the first haptic actuator is a first linear resonant actuator having a first linearly translatable mass that is configured to produce the first portion of the directional haptic output; and the second haptic actuator is a second linear resonant actuator having a second linearly translatable mass that is configured to produce the second portion of the directional haptic output.

9. The electronic system of claim 7, further comprising:

a processor communicatively coupled with the first haptic actuator and the second haptic actuator and configured to:

detect a condition;

determine a first actuation pattern for the first haptic actuator;

determine a second actuation pattern for the second haptic actuator; and in response to detecting the condition, initiate the directional haptic output in accordance with the first actuation pattern and the second actuation pattern.

10. The electronic system of claim 7, wherein:

the first haptic actuator comprises a first mass configured to move along a first horizontal direction, with respect to the first earbud body, when the first earbud is worn in the first ear; and the first mass is configured to produce the first portion of the directional haptic output by imparting a force on the first ear in a single direction.

11. The electronic system of claim 7, wherein:

the first and the second audio outputs correspond output corresponds to a teleconference having multiple participants;

the audio source is a first audio source;

the virtual position is a first virtual position;

the first audio source corresponds to a first participant of the multiple participants;

the first and the second audio outputs further comprise a second audio source, the second audio source corresponding to a second virtual position; and the second audio source corresponds to a second participant of the multiple participants.

12. The electronic system of claim 11, further comprising a processor configured to:

assign the first virtual position to the first audio source; and assign the second virtual position to the second audio source.

13. The electronic system of claim 7, wherein:

the audio source comprises a triggering event; and the triggering event corresponds to an individual speaking.

14. The electronic system of claim 7, wherein the first portion of the directional haptic output overlaps with the second portion of the directional haptic output.

15. The electronic system of claim 7, wherein the second portion of the directional haptic output begins after the first portion of the directional haptic output concludes.

16. A method of providing a directional haptic output, the method comprising:

detecting, in association with an audio signal, an audio source associated with a virtual position;

causing a wearable electronic device to produce an audio output corresponding to the audio source; and while the audio output is being outputted:

causing a first haptic actuator of the wearable electronic device to produce a first portion of a directional haptic output, the first portion of the directional haptic output that configured to indicate the virtual position of the audio source by decreasing in intensity over a first portion of a time span, the first portion of the time span beginning at a first time; and causing a second haptic actuator of the wearable electronic device to produce a second portion of the directional haptic output, the second portion of the directional haptic output configured to indicate the virtual position of the audio source by increasing in intensity over a second portion of the time span, the second portion of the time span beginning at a second time different from the first time.

17. The method of claim 16, wherein:

the directional haptic output comprises a haptic frequency; and the haptic frequency changes over the time span.

18. The method of claim 16, wherein:

detecting the audio source comprises detecting a triggering event in the audio signal; and the triggering event corresponds to a participant speaking within a conference call.

19. The method of claim 16, wherein an amplitude of the directional haptic output changes over the time span.

20. The method of claim 16, further comprising:

determining a variation in an audio characteristic of the audio source; and varying a haptic characteristic of the directional haptic output in accordance with the variation in the audio characteristic of the audio source.

* * * * *